(12) United States Patent
Schultz et al.

(10) Patent No.: US 7,129,101 B2
(45) Date of Patent: Oct. 31, 2006

(54) FAILURE ANALYSIS VEHICLE FOR YIELD ENHANCEMENT WITH SELF TEST AT SPEED BURNIN CAPABILITY FOR RELIABILITY TESTING

(75) Inventors: Richard Schultz, Fort Collins, CO (US); Michael Schmidt, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 51 days.

(21) Appl. No.: 10/921,538

(22) Filed: Aug. 18, 2004

(65) Prior Publication Data
US 2005/0041454 A1    Feb. 24, 2005

Related U.S. Application Data

(63) Continuation-in-part of application No. 10/307,018, filed on Nov. 27, 2002, now Pat. No. 6,781,151.

(51) Int. Cl.
*H01L 21/66* (2006.01)
*G01R 31/26* (2006.01)

(52) U.S. Cl. .......................................... 438/18; 438/17
(58) Field of Classification Search .................. 257/48; 438/17, 18
See application file for complete search history.

(56) References Cited

U.S. PATENT DOCUMENTS 6,781,151 B1 * 8/2004 Schultz et al. ............... 257/48
2004/0031008 A1 * 2/2004 Satoh et al. ................... 716/8

* cited by examiner

*Primary Examiner*—Ngân V. Ngô
(74) *Attorney, Agent, or Firm*—Cochran, Freund & Young, LLC

(57) ABSTRACT

A test vehicle for evaluating a manufacturing process for integrated circuits that uses a more space efficient layout of library driving cells arranged to produce circuits that exercise many interconnections that may be designed at the minimum design parameters of a manufacturing process. The cells can be configured to operate as ring oscillators increasing the effective circuit frequency of the test module allowing higher frequency circuit testing, and shortening the time it takes to perform life cycle testing. Visibly marking cells, combined with electrically isolating error prone circuit segments makes, identifying defects much more efficient. The accessibility of many testing methods allows quick location of root cause failures, which allows improvements to be made to the manufacturing process.

9 Claims, 23 Drawing Sheets

300
SCHEMATIC DIAGRAM
OF A UNIT DELAY CELL

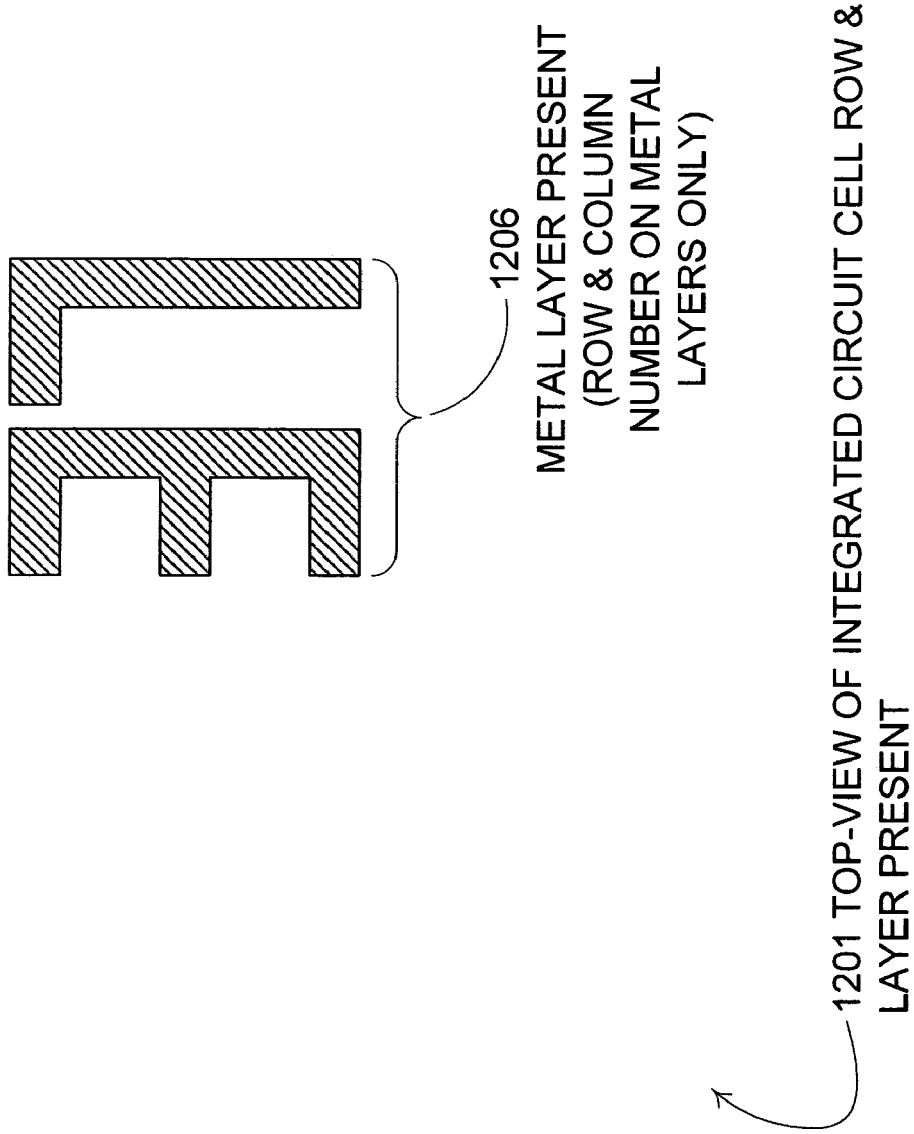

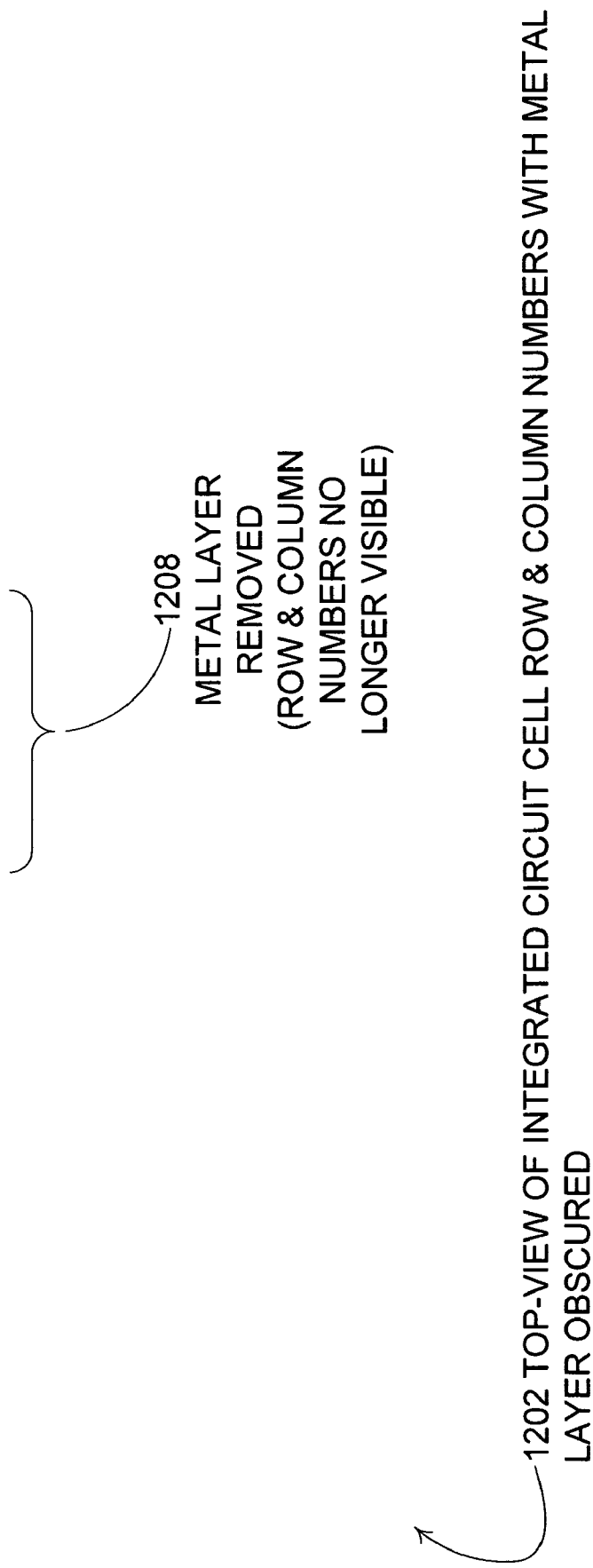

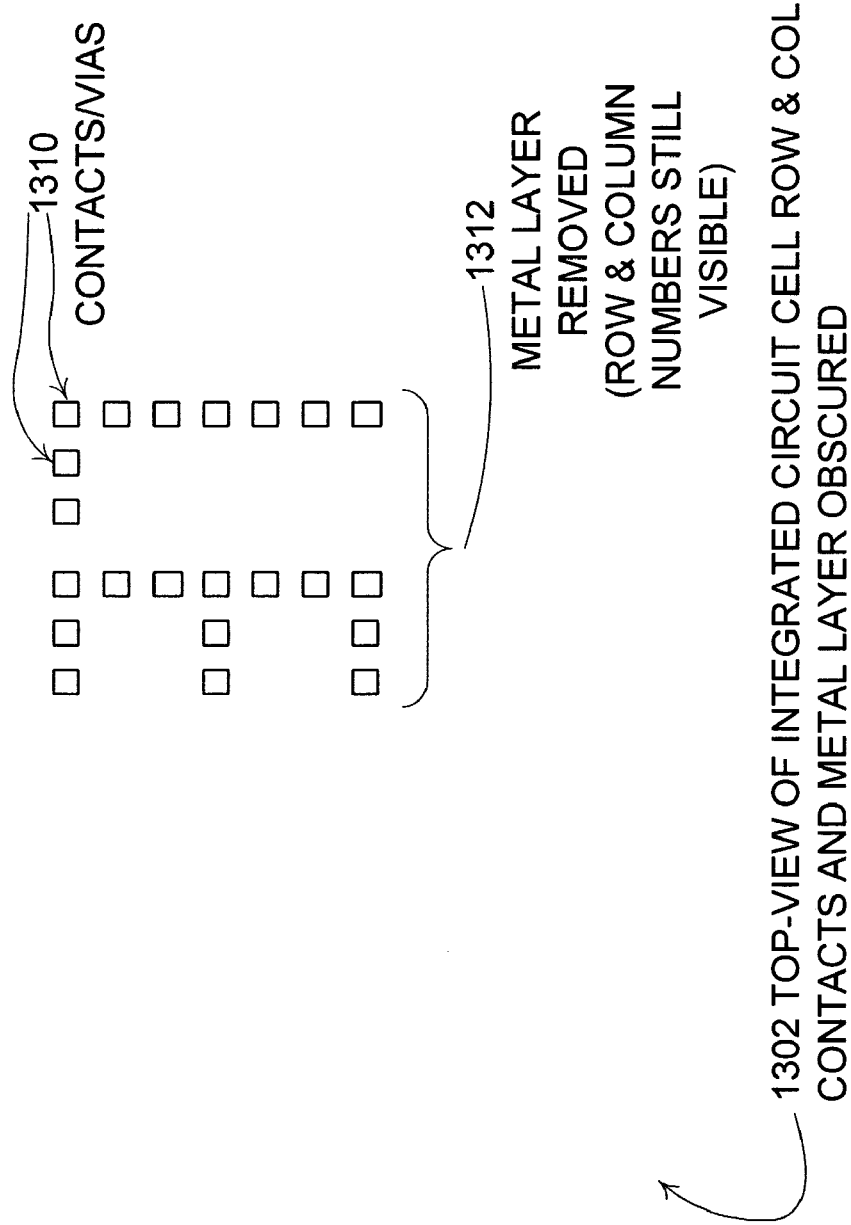

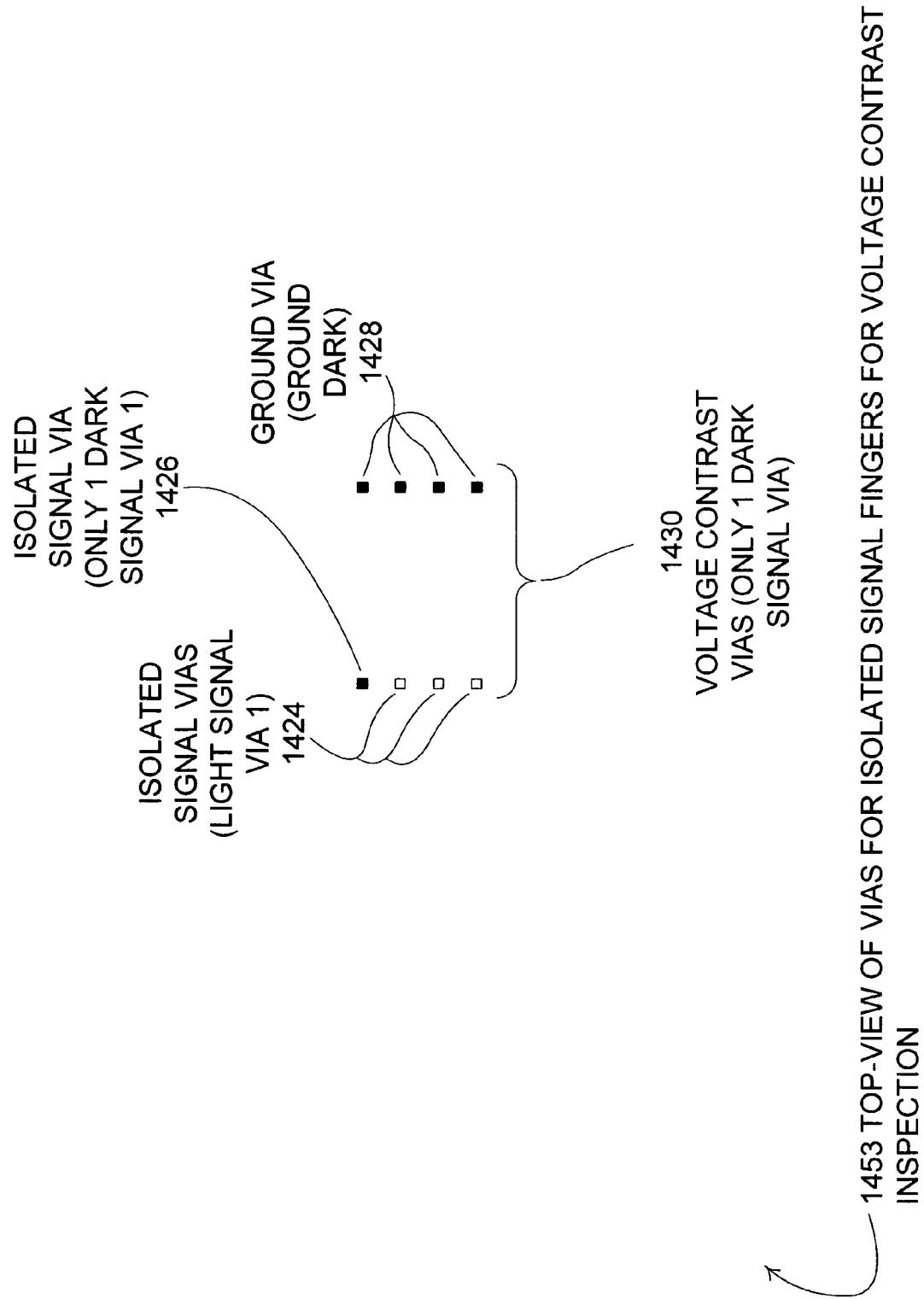

FAILURE ANALYSIS VEHICLE FOR YIELD ENHANCEMENT WITH SELF TEST AT SPEED BURNIN CAPABILITY FOR RELIABILITY TESTING

CROSS REFERENCE TO RELATED APPLICATIONS

This application is a continuation-in-part of U.S. patent application Ser. No. 10/307,018 entitled "Failure Analysis Vehicle" by Richard Schultz and Steve Howard, filed Nov. 27, 2002 now U.S. Pat. No. 6,781,151, the entire contents of the which is hereby specifically incorporated herein by reference for all it discloses and teaches.

BACKGROUND OF THE INVENTION a. Field of the Invention

The present invention pertains to integrated circuit manufacturing and specifically to test samples used to qualify a new manufacturing process.

b. Description of the Background

In the development of a new manufacturing process for integrated circuits, certain design rules are created that define the capabilities of the process. A designer begins the design of new integrated circuits at the same time as the manufacturing capability is being developed. The concurrency of new process development and product design places great importance on the ability of the manufacturing process to be able to produce integrated circuits using those design rules.

The design rules include such things as minimum trace width, minimum distance between traces, the maximum number of vias that may be stacked on top of each other, and other such parameters. Typically, a manufacturer may guarantee that a process will manufacture good parts if the parts conform to the design rules, thus allowing the designers to begin integrated circuit designs many months before the manufacturing process is ready.

After the first production of a new integrated circuit design, there is generally a period of failure analysis as the design and manufacturing processes are adjusted to produce a successful product. The root cause failure analysis of some integrated circuits may be very time consuming, sometimes consuming days or even weeks to isolate a single fault on a single chip.

The failure analysis techniques available to development engineers include mechanical probing, optical beam induced current (OBIC), optical beam induced resistive change (OBIRCH), picosecond imaging circuit analysis (PICA), light induced voltage alterations (LIVA), charge induced voltage alterations (CIVA), various Scanning Electron Microscopy (SEM) techniques, active and passive voltage contrast, Electron Beam (E-Beam), and other techniques known in the art. In addition, destructive tests, such as etching and lapping, may be used to isolate and identify problems.

In many cases, the design of an integrated circuit may limit or prohibit certain techniques for ascertaining faults. For example, in order to probe a certain path using a laser technique, the path must not have another metal trace directly above the path of interest. Further, the various techniques may only isolate a problem within a certain section of the circuitry, but not to a specific trace or via.

E-Beam probing used in concert with active and passive voltage contrast techniques allow significant analysis of a board not typically available with other inspection techniques. With active voltage contrast the current electrical state of an integrated circuit wafer structure can be visibly ascertained. Whether a structure is at VDD, ground, or some indeterminate state is shown by the relative lightness or darkness of the appearance of the structure. Typically, grounded items appear dark, and items at VDD appear light. The dark and light appearance effect can be reversed if desired. Passive voltage contrast operates in a similar fashion, but there is no power applied to the circuit. The substrate is grounded, and the electrons from the SEM or E-Beam charge the ungrounded structures, while the grounded structures do not accept a charge. Passive voltage contrast techniques can be used during fabrication of a wafer to inspect each layer of the wafer as the layer is created, as well as after layers of a wafer have been polished off for closer inspection of obscured layers. The grounded structures typically appear dark while the ungrounded structures appear light. As with active voltage contrast, the darkness and lightness of grounded structures and ungrounded structures can be reversed if desired.

During process development and verification, it is important that faults are isolated to the exact location. For example, a via may have very high resistivity. In order for the manufacturing process to be corrected, the location of the via must be identified exactly. Failure analysis techniques that isolate only a section of an electric path are not sufficient for the fine tuning of the manufacturing process.

SUMMARY OF THE INVENTION

The present invention overcomes the disadvantages and limitations of the prior art by providing a system and method for exercising an integrated circuit manufacturing process while allowing failure analysis personnel access to as many individual connections and components as possible. Quick identification of the row and column of a defective integrated circuit cell speeds the failure analysis process, allowing more efficient and effective fabrication process testing. Further, the present invention may be used to test static performance using direct current as well as dynamic performance with high-speed operational frequencies. An integrated circuit designed at many of the manufacturing process limits offers complete and fast failure analysis so that manufacturing defects can be quickly found and the process improved.

An embodiment of the present invention may therefore comprise a test vehicle for an integrated circuit comprising: a plurality of unit delay cells wherein each unit delay cell comprises a unit cell input, a unit cell output, a library driving cell, and an interconnect module wherein the unit cell input is connected to the library driving cell, the library driving cell is further connected to the interconnect module, the interconnect module is further connected to the unit cell output, the plurality of unit delay cells are connected in series to each other from the unit delay cell output to the unit delay cell input creating a chain of unit delay cells; an input signal trace that is connected to the lead unit delay cell unit cell input of the chain of unit delay cells; and an output signal trace that is connected to the last unit delay cell unit cell output of the chain of unit delay cells.

An embodiment of the present invention may further comprise a method of testing a manufacturing process of an integrated circuit test vehicle comprising the steps of: designing the integrated circuit test vehicle, the integrated circuit test vehicle comprising: a plurality of unit delay cells wherein each unit delay cell comprises a unit cell input, a unit cell output, a library driving cell, and an interconnect module wherein the unit cell input is connected to the library driving cell, the library driving cell is further connected to the interconnect module, the interconnect module is further connected to the unit cell output, the plurality of unit delay cells are connected in series to each other from the unit delay cell output to the unit delay cell input creating a chain of unit delay cells; an input signal trace that is connected to the lead unit delay cell unit cell input of the chain of unit delay cells; and an output signal trace that is connected to the last unit delay cell unit cell output of the chain of unit delay cells; manufacturing the integrated circuit test vehicle using the manufacturing process; applying a test signal to the input signal trace of the integrated circuit test vehicle; reading a result signal from the output signal trace of the integrated circuit test vehicle; comparing the result signal to a predetermined reference signal; and concluding that the manufacturing process is defective if the result signal does not match the predetermined reference signal.

An embodiment of the present invention may further comprise a test vehicle for an integrated circuit comprising: a plurality of unit delay cells wherein each unit delay cell comprises a plurality of unit delay cell inputs, a plurality of unit delay cell outputs, a plurality of library driving cells arranged side-by-side, and a plurality of interconnect modules arranged on overlapping layers, wherein a single unit delay cell input of the plurality of unit delay cell inputs is connected to a single library driving cell of the plurality of library driving cells, the single library driving cell being connected to a single interconnect module of the plurality of interconnect modules, the single interconnect module being connected to a single unit delay cell output of the plurality of unit delay cell outputs; the plurality of unit delay cells being connected in series to each other from the plurality of unit delay cell outputs to the plurality of unit delay cell inputs creating a chain of unit delay cells; a plurality of input signal traces that are connected to the lead unit delay cell plurality of unit cell inputs of the chain of unit delay cells; and a plurality of output signal traces that are connected to the last unit delay cell plurality of unit cell outputs of the chain of unit delay cells.

An embodiment of the present invention may further comprise a method of testing a manufacturing process of an integrated circuit test vehicle comprising the steps of: designing the integrated circuit test vehicle, the integrated circuit test vehicle comprising: a plurality of unit delay cells wherein each unit delay cell comprises a plurality of unit delay cell inputs, a plurality of unit delay cell outputs, a plurality of library driving cells arranged side-by-side, and a plurality of interconnect modules arranged on overlapping layers, wherein a single unit delay cell input of the plurality of unit delay cell inputs is connected to a single library driving cell of the plurality of library driving cells, the single library driving cell being connected to a single interconnect module of the plurality of interconnect modules, the single interconnect module being connected to a single unit delay cell output of the plurality of unit delay cell outputs; the plurality of unit delay cells being connected in series to each other from the plurality of unit delay cell outputs to the plurality of unit delay cell inputs creating a chain of unit delay cells; a plurality of input signal traces that are connected to the lead unit delay cell plurality of unit cell inputs of the chain of unit delay cells; and a plurality of output signal traces that are connected to the last unit delay cell plurality of unit cell outputs of the chain of unit delay cells; manufacturing the integrated circuit test vehicle using the manufacturing process; applying a plurality of test signals to the plurality of input signal traces of the integrated circuit test vehicle; reading a plurality of result signals from the plurality of output signal traces of the integrated circuit test vehicle; comparing the plurality of result signals to a plurality of predetermined reference signals; and concluding that the manufacturing process is defective if the plurality of result signals do not match the plurality of predetermined reference signals.

An embodiment of the present invention may further comprise a test vehicle for an integrated circuit comprising: a plurality of integrated circuit cells wherein each integrated circuit cell of the plurality of integrated circuit cells is visually identified by a row and column number placed on all metal layers of the integrated circuit.

An embodiment of the present invention may further comprise a method of inspecting an integrated circuit comprising the steps of: designing a test vehicle, the test vehicle comprising a plurality of integrated circuit cells wherein each integrated circuit cell of the plurality of integrated circuit cells is visually identified by a row and column number placed on all metal layers of the integrated circuit; manufacturing the test vehicle using an integrated circuit manufacturing process; visually inspecting the test vehicle; and identifying an integrated circuit cell by viewing the row and column number on thee metal layers.

An embodiment of the present invention may further comprise a test vehicle for an integrated circuit comprising: a test circuit pattern placed on one layer of an integrated circuit wafer; a plurality of vias connecting the test circuit pattern to a second layer of the integrated circuit wafer; an electrical connection between the plurality of vias on the second layer of the integrated circuit wafer; and the plurality of vias electrically isolated on the test circuit pattern layer of the integrated circuit wafer so an electrical connection between the plurality of vias of the test circuit pattern is achieved only on the second layer of the integrated circuit wafer.

An embodiment of the present invention may further comprise a method of testing a manufacturing process of an integrated circuit test vehicle comprising the steps of: designing the integrated circuit test vehicle, the integrated circuit test vehicle comprising: a test circuit pattern placed on one layer of an integrated circuit wafer; a plurality of vias connecting the test circuit pattern to a second layer of the integrated circuit wafer; an electrical connection between the plurality of vias on the second layer of the integrated circuit wafer; and the plurality of vias electrically isolated on the test circuit pattern layer of the integrated circuit wafer so an electrical connection between the plurality of vias of the test circuit pattern is achieved only on the second layer of the integrated circuit wafer; manufacturing the integrated circuit test vehicle using the manufacturing process; using passive voltage contrast to examine the test circuit pattern layer as the test circuit pattern layer is created in order to find defects; determining if the test circuit pattern has defects by comparing passive voltage contrast images to predetermined reference passive voltage contrast images; and concluding that the manufacturing process is defective if the passive voltage contrast images do not match the predetermined reference passive voltage contrast images.

An embodiment of the present invention may further comprise a method of examining an integrated circuit test vehicle for a manufacturing process comprising the steps of: designing the integrated circuit test vehicle, the integrated circuit test vehicle comprising: a test circuit pattern placed on one layer of an integrated circuit wafer; a plurality of vias connecting the test circuit pattern to a second layer of the integrated circuit wafer; an electrical connection between the plurality of vias on the second layer of the integrated circuit wafer; and the plurality of vias electrically isolated on the test circuit pattern layer of the integrated circuit wafer so an electrical connection between the plurality of vias of the test circuit pattern is achieved only on the second layer of the integrated circuit wafer; manufacturing the integrated circuit test vehicle using the manufacturing process; using active and passive voltage contrast to examine the test vehicle both with and without power applied in order to find defects; determining if the test circuit pattern has defects by comparing the active and passive voltage contrast images to predetermined reference active and passive voltage contrast images; removing all layers of the integrated circuit test vehicle except the test circuit pattern layer if the active and passive voltage contrast images do not match the predetermined reference active and passive voltage contrast images; using passive voltage contrast to examine the test circuit pattern layer; comparing the test circuit pattern passive voltage contrast images to predetermined reference test circuit passive voltage contrast images; and locating a defect in the test circuit pattern where the test circuit pattern passive voltage contrast images do not match the predetermined reference test circuit passive voltage contrast images.

The advantages of the present invention are that an integrated circuit may be manufactured that stresses many of the design limits of the manufacturing process. Further, the full and unfettered test access to many of the signal traces allows an engineer or technician to quickly pinpoint the exact root cause failure, and thereby quickly ascertain any improvements or changes that need to be made to the manufacturing process. Further, a manufacturing process may be monitored and verified by periodically manufacturing and testing the test vehicle.

BRIEF DESCRIPTION OF THE DRAWINGS

In the drawings,

FIGS. 12A–D are illustrations of an embodiment of integrated circuit cell row and column numbers placed on all metal layers of the integrated circuit wafer to permit easy visual identification of an integrated circuit cell.

FIGS. 13A–D are illustrations of an embodiment of integrated circuit cell row and column numbers placed on all metal layers of an integrated circuit wafer with vias or contacts placed within the row and column numbers to permit easy identification of an integrated circuit cell, even when a metal layer is not exposed.

FIGS. 14A–C are top-views of an embodiment illustrating isolated signal fingers that permit voltage contrast and E-Beam inspection techniques to easily locate defects in the integrated circuit.

DETAILED DESCRIPTION OF THE INVENTION

Figure 1:
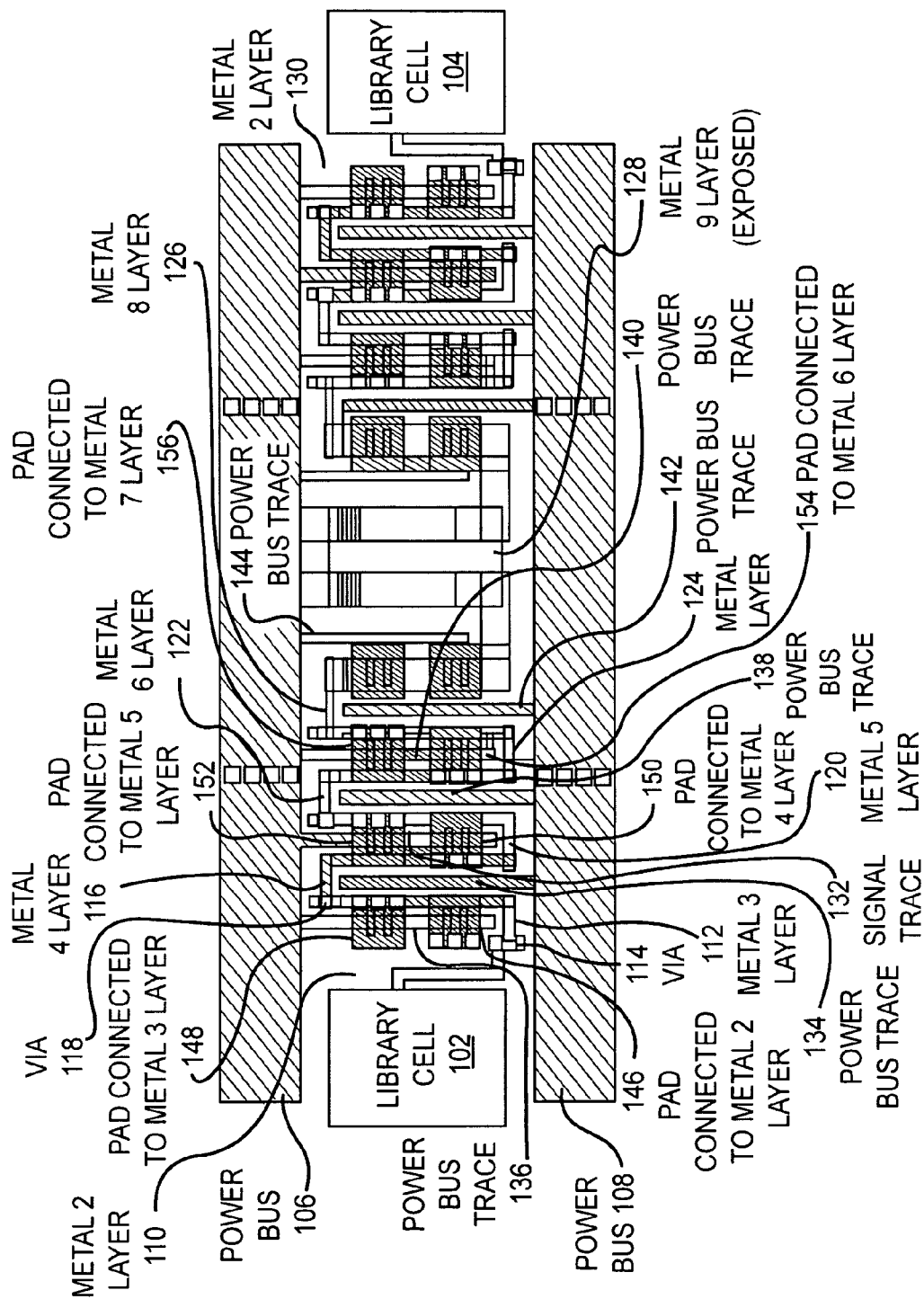
FIG. 1 is an illustration of an embodiment of a staircase interconnect between two library cells of an integrated circuit.

FIG. 1 illustrates an embodiment 100 of a staircase interconnect between two library cells 102 and 104 of an integrated circuit. Two power busses, 106 and 108, supply power to the cells, 102 and 104. The signal trace leaving cell 102 begins on the metal 2 layer 110 and transfers to the metal 3 layer 112 with the via 114. The signal trace then transfers to the metal 4 layer 116 with the via 118. The signal trace continues to metal 5 layer 120, metal 6 layer 122, metal 7 layer 124, and metal 8 layer 126 in a serpentine fashion. The signal trace continues to metal 9 layer 128. The serpentine pattern is repeated in a similar fashion from metal 9 layer 128 to metal 2 layer 130 and into the second library cell 104.

Within each serpentine pattern, a trace from a power bus is placed in close proximity. For example, on the metal 4 layer 116, the signal trace 132 is in close proximity to the trace 134 that is connected to the power bus 108. In a similar fashion, power bus traces 136, 138, 140, 142, and 144 are interleaved within the staircase. In addition, a trace from one of the power buses may be placed directly below the signal trace in some embodiments. The traces may be placed as close to each other as allowable by the manufacturing process parameters. The signal trace may be exposed to the top of the integrated circuit, and thereby probed using various failure analysis techniques. In some embodiments, a power trace may be placed directly underneath the signal trace.

In many cases, each layer of an integrated circuit must contain a certain minimum amount of metal to minimize the stress induced in the integrated circuit die. Such conditions may be satisfied using the present design by those skilled in the art. In some cases, additional traces within each layer may have to be constructed to meet the minimum metal requirements. In other embodiments, the minimum amount of metal may be satisfied with the basic staircase design.

Exposed test pads residing on the metal 9 layer are connected to the signal traces at each metal layer. Thus, pad 146 is connected to metal 2 layer 110, pad 148 to metal 3 layer 112, pad 150 to metal 4 layer 116, pad 152 to metal 5 layer 120, pad 154 to metal 6 layer 122, and pad 156 to metal 7 layer 124. Pads may also be provided on the descending portion of the staircase.

The staircase interconnect 100 is an integrated circuit design that can be used to stress a manufacturing process. All of the signal trace widths may be at the minimum size as well as the minimum spacing between widths. Further, there are a large number of vias within the signal path between two library cells 102 and 104. Vias are a high failure rate item in a typical manufacturing process for integrated circuits and are, thus, present to stress the manufacturing process.

The staircase interconnect 100 is designed for testability and for fault isolation. Each signal trace on each level has a corresponding test pad accessible from the metal 9 layer. This allows many test techniques to be used to identify and isolate a single broken via. In order to determine the exact root cause for a failure, it is desirable to locate the exact via or trace where a failure occurred. For example, if a via fails at metal 5 layer, the masks, dies, or other processing equipment may be examined for that specific layer. If the fault were not isolated to a specific layer and the specific via within that layer, the manufacturing process cannot be as thoroughly checked and, thus, process development will proceed at a slower pace.

The embodiment allows a process development engineer to produce a hard-to-manufacture design while giving the engineer as many mechanisms for evaluating failures as possible. By manufacturing an integrated circuit with a multitude of staircase interconnects 100, a test sample may be produced at the limits of the manufacturing processes, but can also be quickly evaluated to pin point any failures using as many failure analysis techniques as needed.

Those skilled in the art may design a staircase interconnect with various numbers of metal layers and with various minimum path widths or spacing between signal paths, while keeping within the spirit and intent of the present invention.

Figure 2:
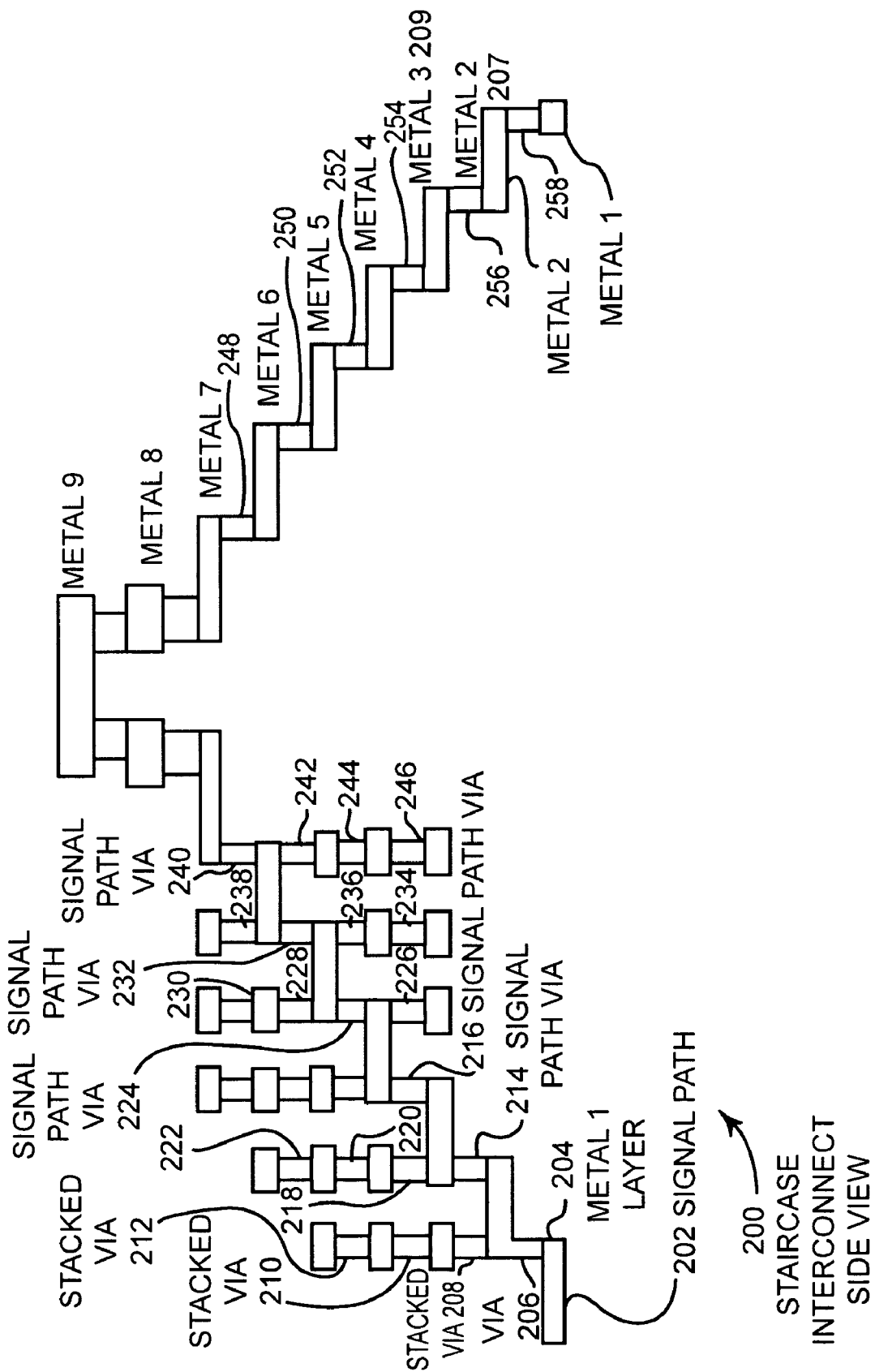
FIG. 2 is an illustration of an embodiment of a schematic representation of the elevation of the staircase interconnect wherein stacked and non-stacked vias are used.

FIG. 2 illustrates a schematic representation of the elevation of the staircase interconnect 200 wherein stacked and non-stacked vias are used. The signal path 202 enters the staircase from a logic cell on metal 1 layer 204. The via 206 transfers the signal to metal 2 layer 207. The via 206 has three stacked vias 208, 210, and 212 immediately above via 206. The signal path again transfers to metal 3 layer 209 at via 214. Again, three stacked vias 218, 220, and 222 are placed directly above via 214. Via 224 has one via 226 below and two vias 228 and 230 above. Via 232 has vias 234 and 236 below and via 238 above via 232. Vias 242, 244, and 246 are below via 240. Vias 248, 250, 252, 254, 256, and 258 have no stacked vias.

The staircase interconnect 200 tests many possible via geometries within a single staircase. In the downward portion of the staircase, i.e., the vias 248, 250, 252, 254, 256, and 258, there are no stacked vias present for independent vias between each layer present in the integrated circuit. In the upward portion of the staircase, the signal transfer via is contained within each combination of stacked vias. In some embodiments, stacked vias may be present on both portions of the staircase. Such embodiments may be useful for evaluating a manufacturing process where stacked vias are an especially serious problem and the manufacturing parameters for the process are to be evaluated.

Many integrated circuit manufacturing processes have limitations on the number stacked vias. The limitation may be due in part to the stress imparted in the integrated circuit due to the stacked vias. In the present embodiment of a staircase interconnect 200, the maximum number of stacked vias may be four. Thus, every combination or placement of stacked vias may be implemented. Those skilled in the art may be able to design staircase interconnects wherein the maximum number of stacked vias ranges from zero to the total number of metal layers within the integrated circuit. In some embodiments, the stacked vias may not be implemented in the staircase.

The number of layers in the integrated circuit may be different for various embodiments. For each layer of the integrated circuit, dies and masks must be manufactured, adding to the cost. Thus, for early manufacturing process development, an embodiment with three to five layers may be constructed to perform preliminary development, then an embodiment with the maximum number of layers possible by the process may be constructed for the final process development stages. For each integrated circuit manufacturing process, different numbers of maximum layers may be possible.

Figure 3:
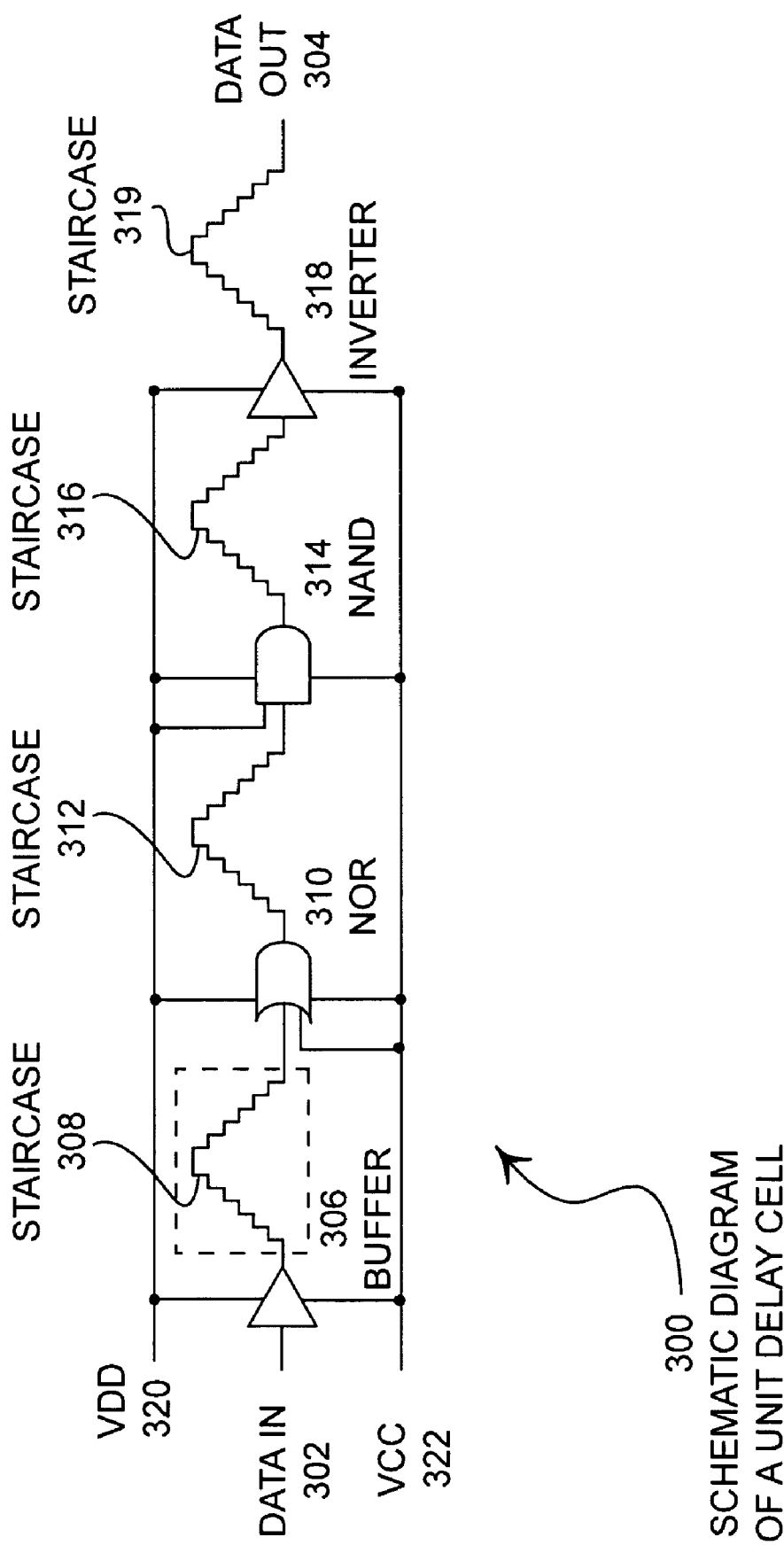
FIG. 3 is an illustration of an embodiment of a unit delay schematic.

FIG. 3 illustrates an embodiment 300 for a unit delay schematic. The data in 302 passes through a circuit to the data out 304. The circuit comprises a buffer 306, a staircase of vias 308, a NOR gate 310, a second staircase 312, a NAND gate 314, a third staircase 316, an inverter 318, and a fourth staircase 319. The power bus comprises VDD 320 and VCC 322, which are connected to the NOR 310 and NAND 314 so that a positive signal is transmitted through the circuit. The time that is taken for the signal to propagate through the circuit can be known.

In a typical embodiment, the circuit 300 may be connected end to end many times, possibly hundreds or thousands of times in a single integrated circuit. The unit delay circuit 300 may be used in several different useful embodiments.

Figure 4:
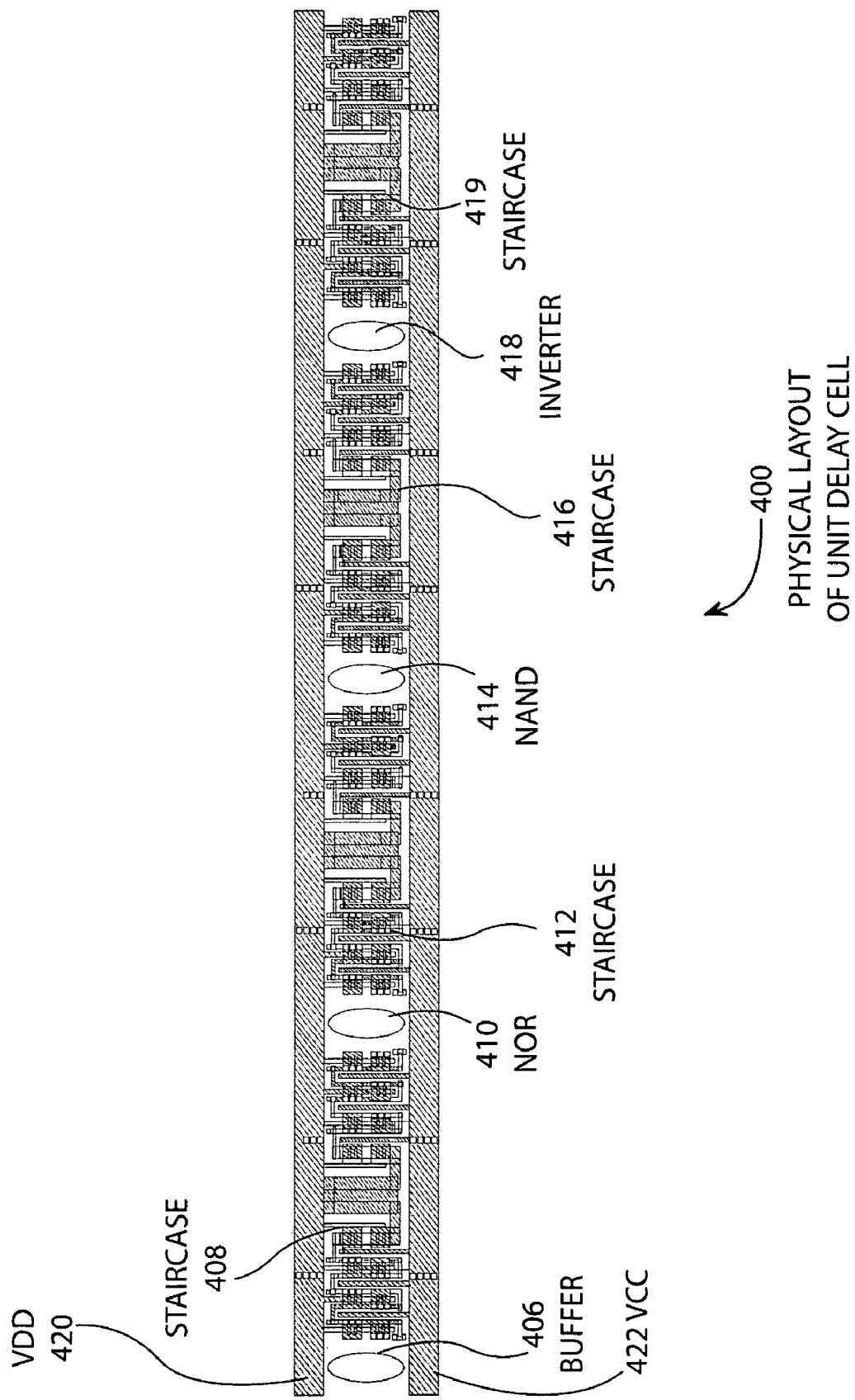
FIG. 4 is an illustration of an embodiment of a physical layout of the unit delay cell illustrated in FIG. 3.

FIG. 4 illustrates an embodiment 400 of a physical layout of the unit delay cell illustrated in FIG. 3. The circuit comprises the buffer 406, a first staircase 408, a NOR gate 410, a second staircase 412, a NAND gate 414, a third staircase 416, an inverter 418, and a fourth staircase 419. The VDD 420 and VCC 422 power busses are also shown.

The cells may be arranged such that the power busses are aligned. This arrangement allows easy mechanical cross sectioning of the circuits to inspect problem areas. In the cross sections, known good traces may be compared to suspected bad traces because of the repeating pattern of the embodiment 400.

Figure 5:
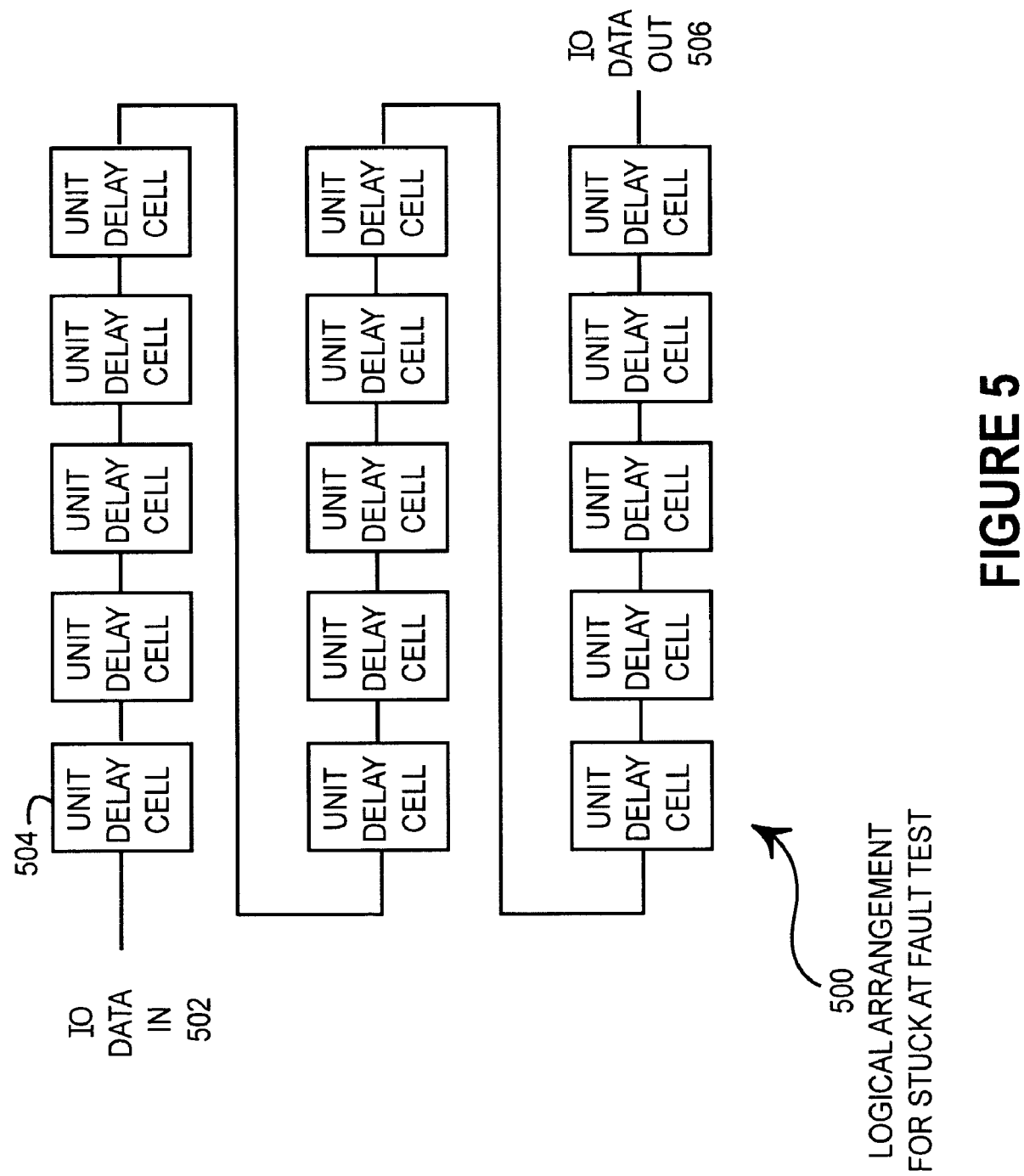
FIG. 5 is an illustration of an embodiment of a stuck at fault test.

FIG. 5 illustrates an embodiment 500 of a stuck at fault test. A data in line 502 propagates through a series of unit delay cells 504 and exits as data out line 506. Any number of unit delay cells 504 may be used. Some embodiments may contain thousands or hundreds of thousands of unit delay cells.

When the data in line 502 is brought high, the signal propagates through each unit delay cell until a fault is reached. For example, if a single via was open or highly resistive, the signal would propagate until the faulty via were reached. Because of the test pads available in the staircase, a test engineer can simply and readily determine the exact location of the via, including the metal layer on which the via is located.

Each unit delay cell contains four staircases, each containing many vias. In a typical manufacturing process, the failure rate for vias or other integrated circuit components during process development may be in the range of 1:100,000 or higher. Thus, it may be useful to have circuits with at least 100,000 or 1,000,000 vias that are easily analyzed for failures. The manufacturing process is stressed by having to manufacture a very high number of vias or other difficultto-manufacture features. The process can be easily tested by simply applying a voltage to the data in 502 and reading the result at data out 506.

Many different test techniques may be used to determine the location of a problem. The staircase has exposed test pads that may be mechanically probed, as well as front or back side AC laser probing, front or back side DC emission microscopy, DC Current Monitoring OBIC and OBIRCH for Resistive Defects, PICA AC Emission Acquisition, LIVA DC Fault Isolation, EBEAM AC Signal Acquisition, EBEAM Pattern Dependent DC Passive Voltage Contrast, SEM Passive Voltage Contrast, and Mechanical Probing including AC Active Pico Probing, DC Voltage Probing, and DC Active Control Probing.

The design of the unit delay cell shown in FIG. 4 can allow direct access to all of the traces within the staircase from the top, providing full coverage for the various failure analysis techniques. For example, because the signal traces are visible from the top, various laser excitement failure analysis techniques may be used to isolate problems on any portion of a signal path on any layer. In debugging other integrated circuits that are not specifically designed for testability, many portions of a signal path may be obscured by overlapping traces.

Figure 6:
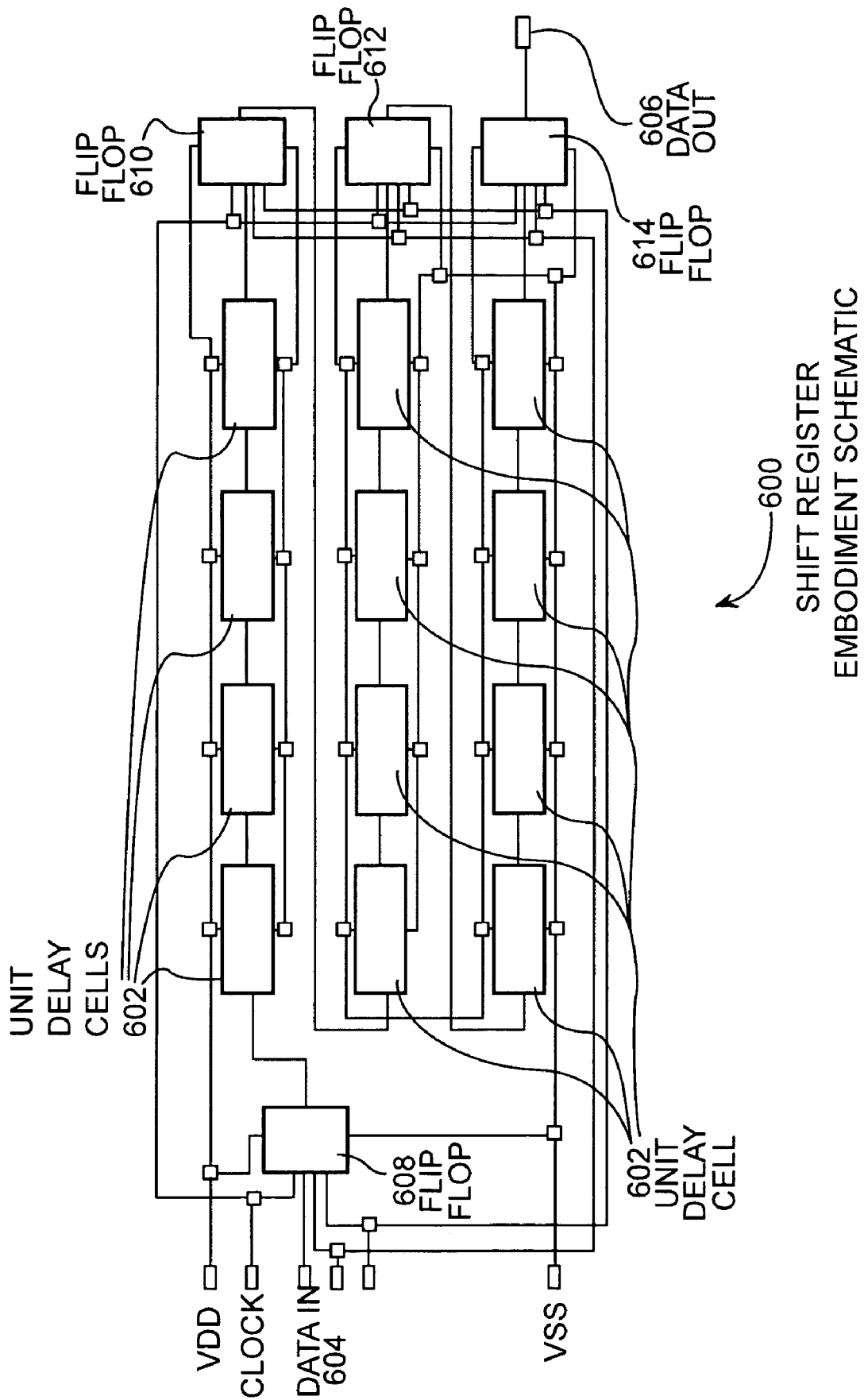
FIG. 6 is an illustration of an embodiment of a shift register wherein the unit delay cells are configured to easily perform a high speed test.

FIG. 6 illustrates an embodiment 600 of a shift register wherein the unit delay cells 602 are configured to easily perform a high speed test. The data in 604 travels through a flip flop 608 to a string of unit delay cells 602 to a second flip flop 610. The signal travels out of the second flip flop 610 through a second string of unit delay cells 602 to a third flip flop 612. The signal travels out of the third flip flop 612, through a third string of unit delay cells 602 to a fourth flip flop 614. All of the flip flops share a common clock line.

With each clock cycle, data must simultaneously propagate through the rows of the unit delay cells 602. If a problem exists within one of the many unit delay cells, the data will not propagate properly and will become corrupted. Such problems will become more apparent when the clock speeds are high.

The present embodiment is directed at high speed testing of the integrated circuit whereas the embodiment 500 was directed at static testing of the circuitry. The present embodiment, when tested at high speeds, will detect more subtle resistive changes between elements and may be a more thorough test of the manufacturing process.

In different embodiments, the string of unit delay cells 602 may be of different lengths and the number of flip flops may also be different. For example, when many unit delay cells are used, the propagation times will be high and thus the clock speeds will be lower. Such an example may be useful when the available test equipment may not be fast enough to test shorter strings of delay cells. The number of delay cells may range from one to several hundred or more in some embodiments. Further, the number of rows of the shift register may be more or less, depending on the number of unit delay cells necessary to adequately test the manufacturing process and depending on the available die space of the integrated circuit.

In some embodiments, a shift register embodiment 600 and a stuck at fault test embodiment 500 may be present on a single integrated circuit. Other embodiments may be created by those skilled in the arts that incorporate other test circuits while maintaining within the spirit and intent of the present invention.

Figure 7:
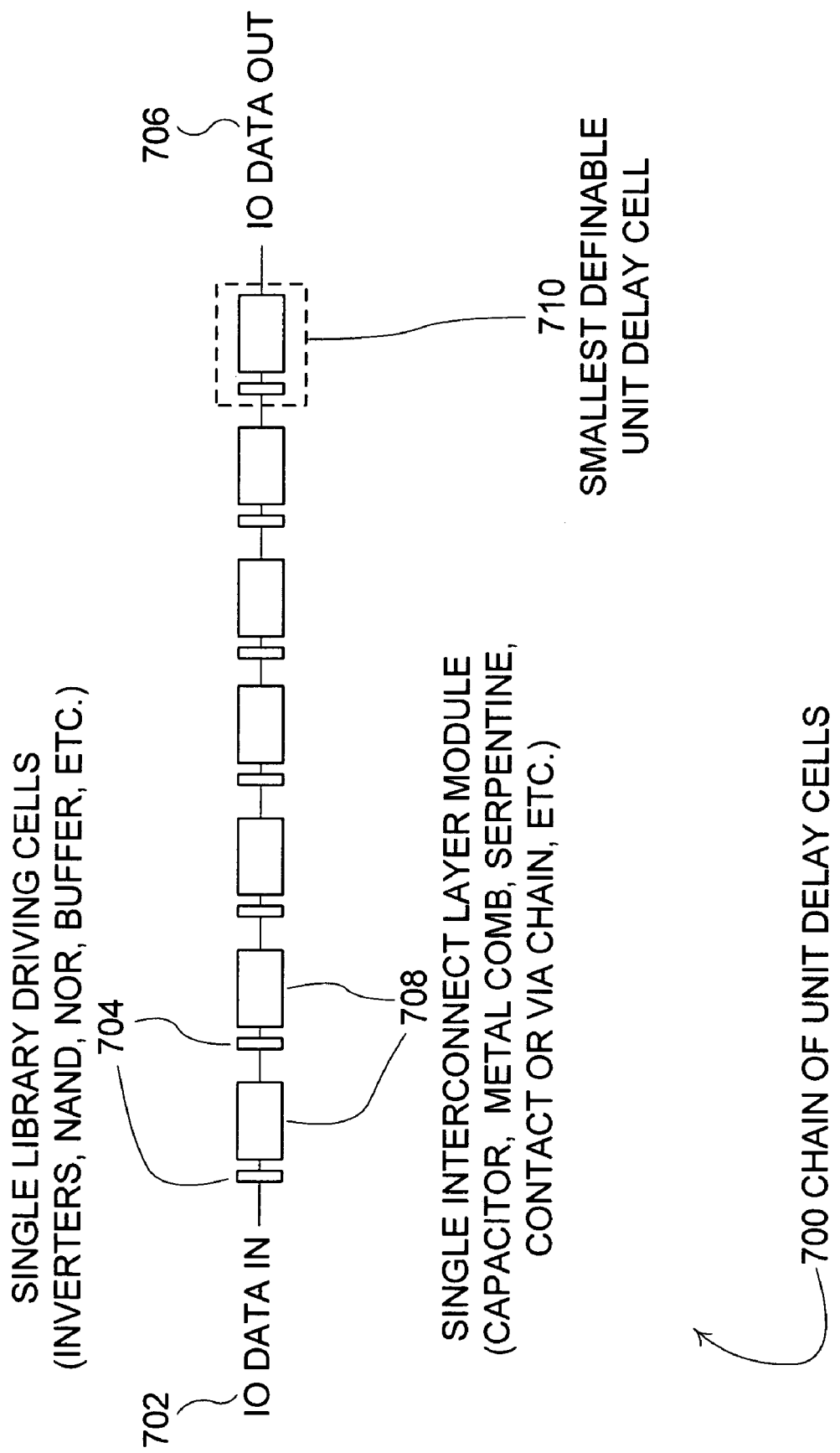
FIG. 7 is an illustration of an embodiment of a chain of unit delay cells.

FIG. 7 is an illustration of an embodiment 700 of a chain of unit delay cells 710. The embodiment 700 is similar to the unit delay cells disclosed with respect to the description of FIGS. 3 & 4. The smallest definable unit delay cell 710 consists of a single library driving cell 704 and a single interconnect module 708. As was disclosed in the description of FIG. 5, the unit delay cells 710 can be connected together to create various embodiments which may consist of thousands or hundreds of thousands of unit delay cells 710. An Input/Output (IO) data input signal 702 is sent to the first library driving cell 704, and is then transmitted to the interconnect module 708. The serial combination of the library driving cell 704, connected to interconnect module 708 is repeated as many times as necessary to create a chain that is sufficient to test the fabrication process. At the end of the unit delay cell chain an IO data output signal 706 is used to show the result of the chain of unit delay cells 710. The IO data output signal 706 can be compared to the expected result to determine if there are any defects in the test vehicle. There is a single library driving cell 704 used with a single layer interconnect module 708 for each unit delay cell 710 in the chain. The single library driving cell 704 may be one of a number of logical devices, including, but not limited to an: inverter, NAND gate, NOR gate, buffer, etc. The single interconnect layer module 708 may consist of a number of test circuit patterns including, but not limited to a: capacitor, metal comb, serpentine, contact/via chain, etc. The contact/via chain may utilize more than one layer to create the interconnect module 708.

Figure 8:
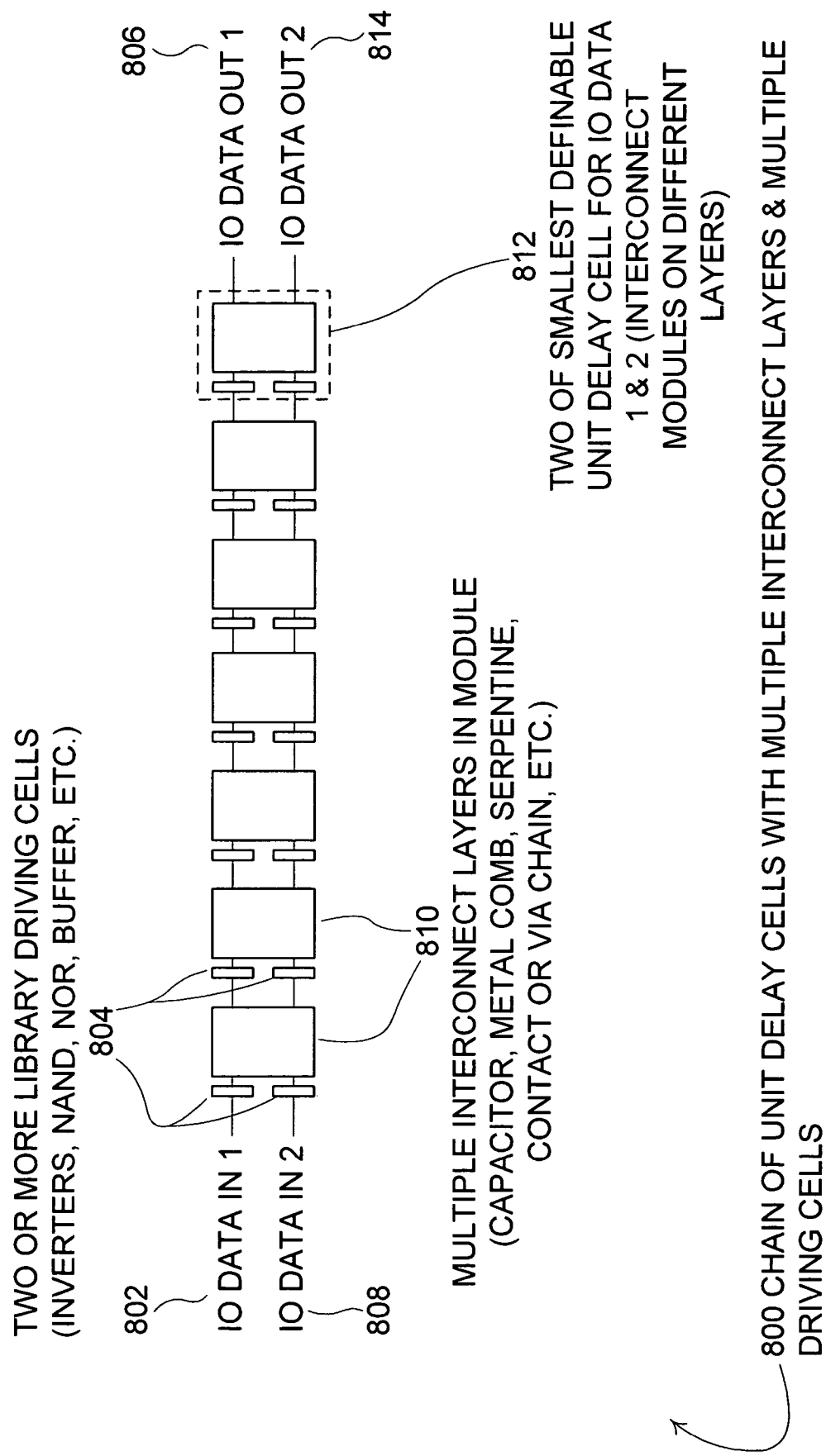
FIG. 8 is an illustration of an embodiment of a chain of unit delay cells wherein there are multiple interconnect modules placed on multiple layers with corresponding multiple library driving cells, arranged to make more efficient use of all layers of the integrated circuit wafer.

FIG. 8 is an illustration of an embodiment 800 of a chain of unit delay cells 812 wherein there are multiple interconnect modules 810 placed on multiple layers with corresponding multiple library driving cells 804, arranged to make more efficient use of all layers of the integrated circuit wafer. The multiple layers of the library driving cells 804 and the overlapping layers of the interconnect modules 810 are disclosed in more detail with respect to the description of FIG. 9. The multiple layers of the library driving cells 804 and the overlapping layers of the interconnect modules 810 are discussed with regard to FIG. 8 to allow a more complete understanding of the embodiment. Each library driving cell 804 may use six to seven layers of the integrated circuit wafer. The interconnect modules 810 typically use one layer, or only need a few layers in the case of a contact or via chain. Because the interconnect modules 810 appear on a small portion of the six to seven layers of the wafer needed to create the library driving cell 804, the embodiment 800 may put two, or more, library driving cells 804 side-by-side so the corresponding interconnect modules 810 can be layered on top of each other. The library driving cells 804 connect to different, corresponding, interconnect modules 810 that may be placed on different layers of the integrated circuit wafer, thus, using the entire width of the multiple library driving cells 810. Using multiple layers for the interconnect modules allows one skilled in the art to place more test patterns in the same area of the integrated circuit wafer as was used for a single test pattern when using only one layer for the interconnect module 810. Each library driving cell 804 has an isolated input 802, 808. The embodiment 800 may chain the library driving cells 804 and the interconnect modules 810 in a manner similar to that disclosed in the description of FIG. 7. For an embodiment of the invention 800 using multiple interconnect module layers 810 and multiple library driving cells 804, the smallest definable unit delay cell 812 is defined as a single library driving cell 804 connected to a single interconnect module 810. The unit delay cell 812 of the embodiment 800 illustrated consists of two separate unit delay cells 812 that overlap due to the multiple layers of the interconnect modules 810. The interconnect modules 810 are layered on top of each other so the unit delay cell 812 consists of a single library driving cell 804, and the layer of the interconnect module 810 that contains the interconnect module 810 connected to the selected library driving cell 804. The IO data inputs 802, 808 are typically isolated, but can be tied together if desired by one skilled in the art. At the end of the unit delay cell 812 chain there are multiple IO data output signals 806, 814 used to show the result of the unit delay cell 812 chains. The IO data output signals 806, 814 can be compared to the expected values of the unit delay cell 812 chains to determine if any process defects are present. Similar to the embodiment disclosed with respect to the description of FIG. 7, the embodiment 800, having multiple driving cells 804 and multiple interconnect module layers 810, may be arranged in a variety of configurations using many or fewer unit delay cells 812 in a chain, as well as different types of interconnect modules 810. The library driving cells 804 may be one of a number of logical devices, including, but not limited to an: inverter, NAND gate, NOR gate, buffer, etc. The interconnect modules 810 may consist of a number of test circuit patterns including, but not limited to a: capacitor, metal comb, serpentine, contact/via chain, etc.

Figure 9:
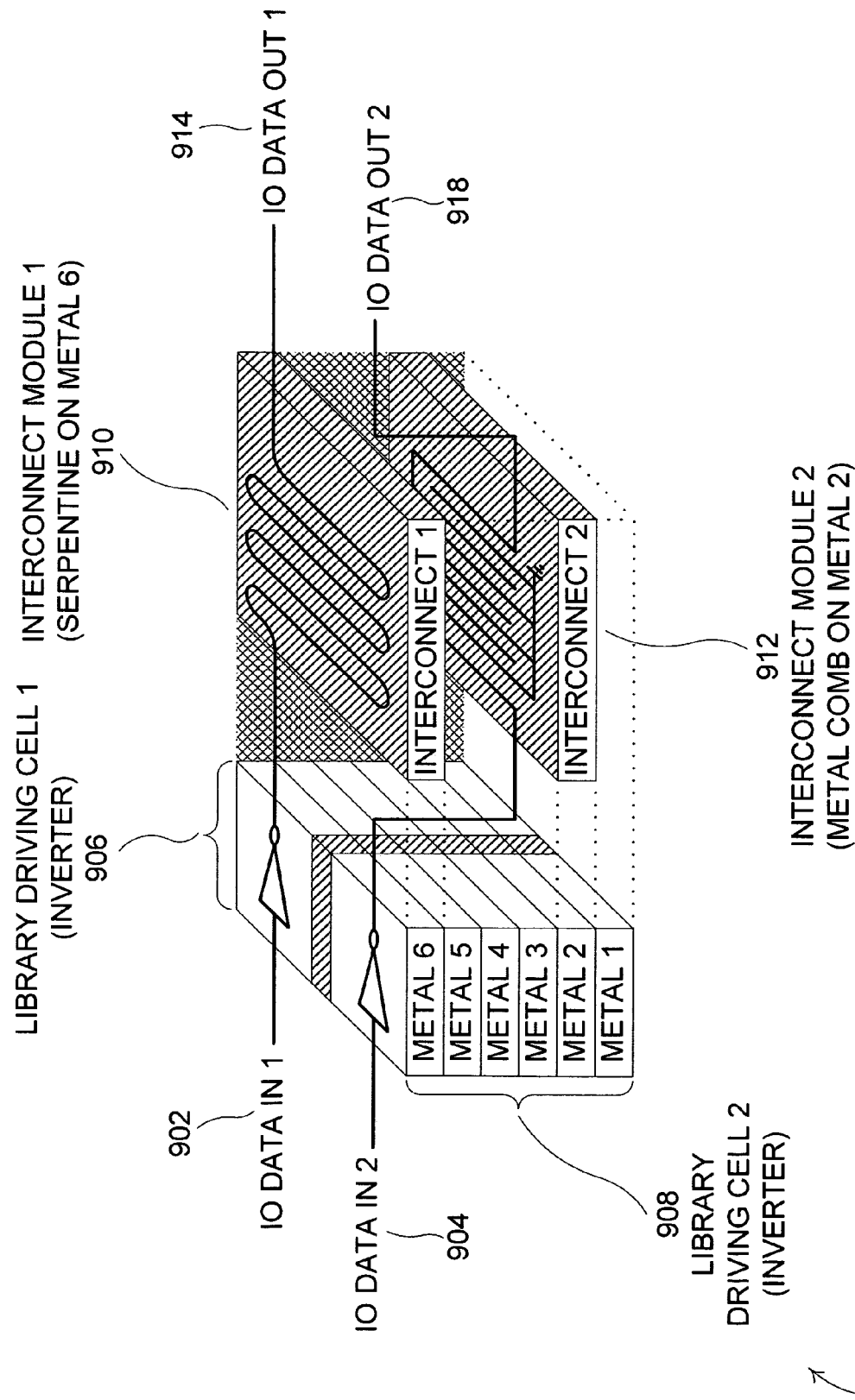
FIG. 9 is a three-dimensional illustration of the physical layout of unit delay cells of the embodiment illustrated in FIG. 8 where there are multiple interconnect modules placed on multiple layers with corresponding multiple library driving cells.

FIG. 9 is a three-dimensional illustration of the physical layout of unit delay cells 900 of the embodiment illustrated in FIG. 8 where there are multiple interconnect modules 910, 912 placed on multiple layers with corresponding multiple library driving cells 906, 908. The library driving cells 906, 908 require multiple integrated circuit layers. In the embodiment 900, the library driving cells 906, 908 are inverters, but the library driving cells 906, 908 may be one of a number of logical devices, including but not limited to an: inverter, NAND gate, NOR gate, buffer, etc. Each interconnect module 910, 912 typically uses a single layer of the integrated circuit wafer and may consist of a number of test patterns including, but not limited to a: capacitor, metal comb, serpentine, contact/via chain, etc. A serpentine interconnect module 910 and a metal comb interconnect module 912, each on a single layer of the integrated circuit wafer, are illustrated as embodiment 900. With multiple driving cells 906, 908, the interconnect modules 910, 912 can be stacked on top of each other in order to maximize space usage, and maximize the testing of the integrated circuit fabrication process for a single test vehicle. The first library driving cell 906 receives an IO data input signal 902 which is processed by the first library driving cell 906. The signal then goes to the serpentine interconnect module 910 on the same layer as the IO data input signal 902. Once the signal passes through the serpentine interconnect module 910, the signal is sent on the same layer as IO data input 902 to IO data output 914. The second library driving cell 908 receives a second IO data input 904 on the same layer as the first IO data input 902. The second IO data input 904 is processed by the second library driving cell 908. The signal then goes to the metal comb interconnect module 912 on a different layer than the library driving cell 908 output and the IO data input 904. Once the signal is through the metal comb interconnect module 912, the signal returns to the layer for the IO data inputs 902, 904 and is sent as IO data output signal 918. The IO data output signals 914, 918 can be attached as the external IO connection, or linked to another unit delay cell in a chain of unit delay cells. The number of driving cells 906, 908 can be expanded to match the layers available for the chosen types of interconnect modules 910, 912. One skilled in the art may also configure the interconnect layers 910, 912 to take an entire layer, or to share a small portion of a layer with another interconnect module. For example, a via chain that takes only a small portion of multiple layers of an integrated circuit may be used with other test circuit patterns, where the other test circuit patterns take up the remaining width of an integrated circuit layer.

Figure 10:
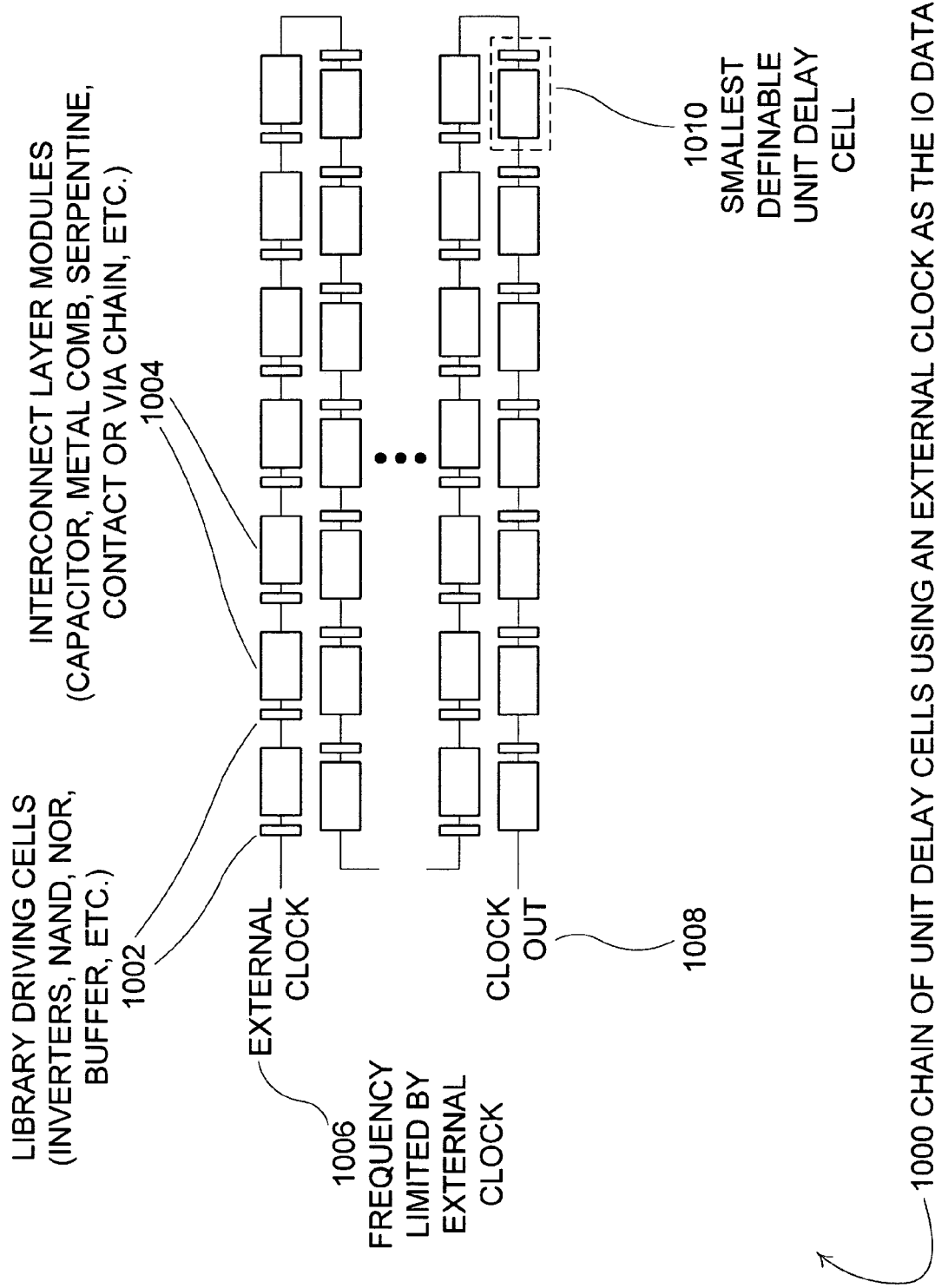
FIG. 10 is an illustration of an embodiment of a chain of unit delay cells using an external clock as the data input to permit frequency testing.

FIG. 10 is an illustration of an embodiment 1000 of a chain of unit delay cells 1010 using an external clock 1006 as the data input to permit frequency testing. The embodiment 1000 is one of the embodiments that may be created using the logical arrangement similar to FIG. 5. The external clock 1006 is used to drive a chain of unit delay cells 1010. The smallest definable unit delay cell 1010 consists of a single library driving cell 1002 and a single interconnect module 1004. The signal passes through the chain of unit delay cells 1010 until it reaches the end of the chain of unit delay cells and is output as the clock output signal 1008. The clock output signal 1008 can be compared to the expected output signal to determine if there are any process defects in the test vehicle. The library driving cells 1002 may be one of a number of logical devices, including, but not limited to an: inverter, NAND gate, NOR gate, buffer, etc. The interconnect modules 1004 may consist of a number of test circuit patterns including, but not limited to a: capacitor, metal comb, serpentine, contact/via chain, etc.

Figure 11:
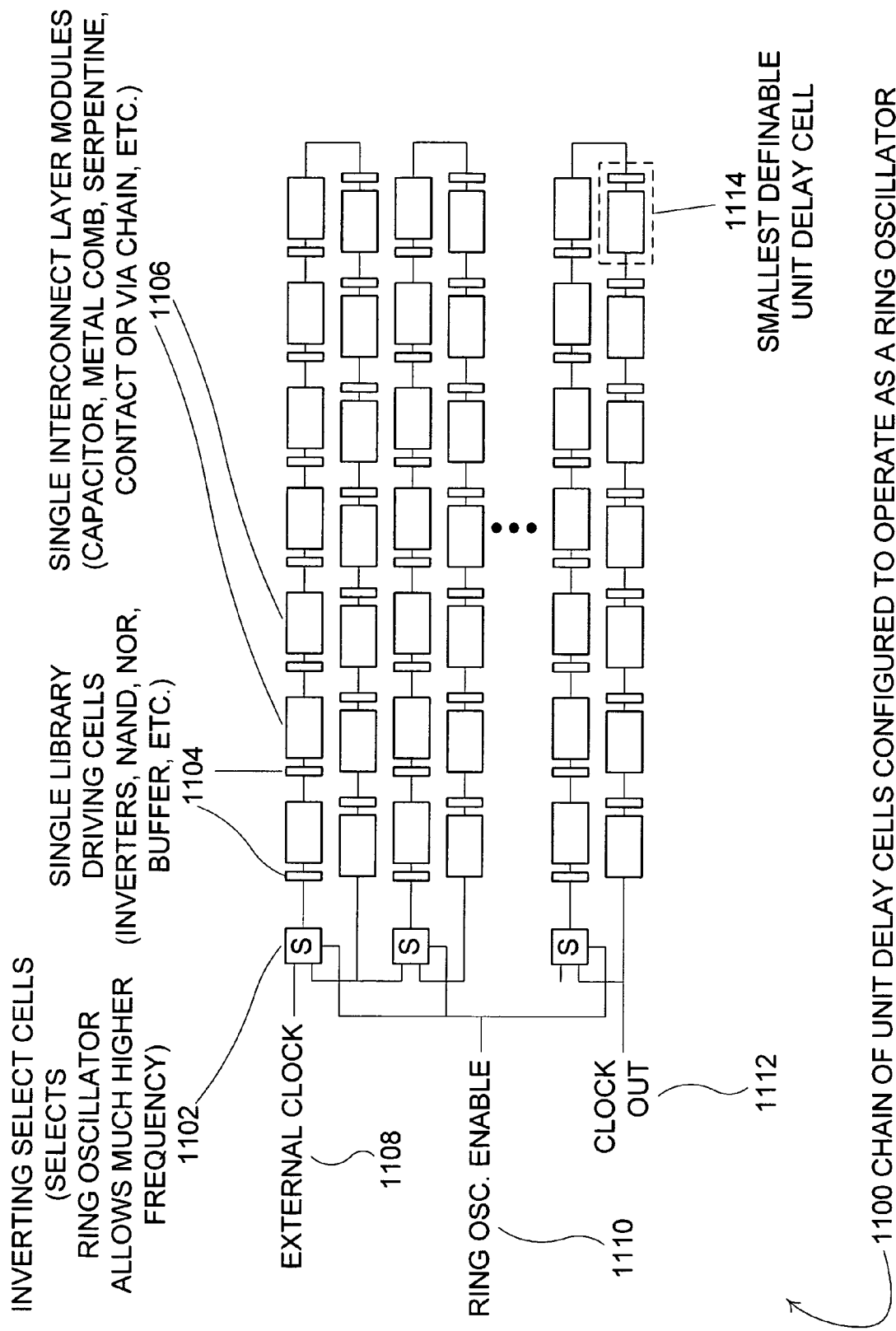
FIG. 11 is an illustration of an embodiment of a chain of unit delay cells configured to operate as a ring oscillator to permit higher frequency testing of the test vehicle without the need for an external clock.

FIG. 11 is an illustration of an embodiment 1100 of a chain of unit delay cells 1114 configured to operate as a ring oscillator to permit higher frequency testing of the test vehicle without the need for an external clock 1108. The ring oscillator embodiment 1100 uses inverting select cells 1102 to select between using the external clock 1108 or tying the unit delay cell 1114 chain output back into the originating inverting select cell 1102 in order to create a ring oscillator circuit. A single library driving cell 1104, which is connected to a single interconnect module 1106, is the smallest definable unit delay cell 1114. When a unit delay cell chain is used as a ring oscillator 1100, the external clock input 1108 is not necessary because the inverting select cell will send the unit delay cell output signal as the unit delay cell chain input instead of the external clock input 1108. The ring oscillator enable input 1110 is a switch that turns the ring oscillator circuit on and off. When the ring oscillator enable input 1110 is on, the signal propagates through the circuit until it is tied back into the originating inverting select cell 1102 input. The change of state of the propagated signal of the unit delay cell chain causes the inverting select cell 1102 output to change state, and propagate a change of state through the unit delay cell 1102 chain. The frequency of the ring oscillator is the inverse of the cumulative delay of each of the library driving cells 1104 plus the cumulative delay of each of the interconnect layer modules 1106 in the test chain. By tying the output of one unit delay cell 1114 chain into the inverting select cell 1102 external clock input 1106 of another unit delay cell 1110 chain, different unit delay cell 1110 chains may be made to operate at different frequencies. The ring oscillator configuration 1100 allows the test vehicle to operate internally at very high frequencies, i.e., two-hundred MHz or more, while still creating a clock output 1112 that can be divided down to a lower frequency. Thus, the clock output signal 1112 can be measured by inexpensive frequency meters. The high internal frequencies allow testing closer to the hundreds of MHz to GHz of an integrated circuit product, as well as extended life testing since the circuit can be cycled much faster allowing a shortened time period to achieve the same number of state changes as an embodiment dependent on an external clock. The stepped-down clock output 1112 frequency is beneficial because frequency meters go up in cost as the top end of the frequency range of the frequency meter is increased.

Figure 12C:
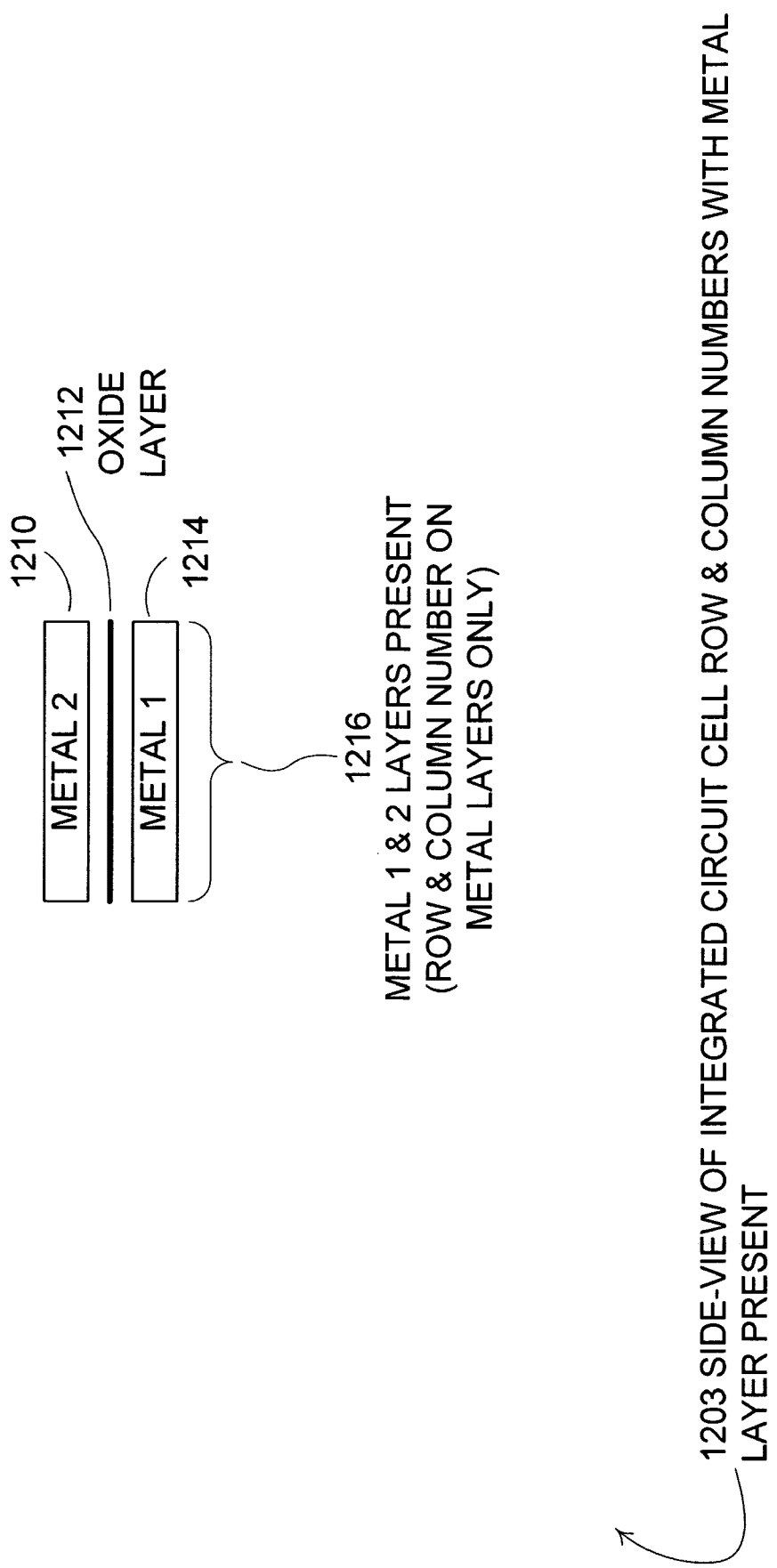
Figure 12D:
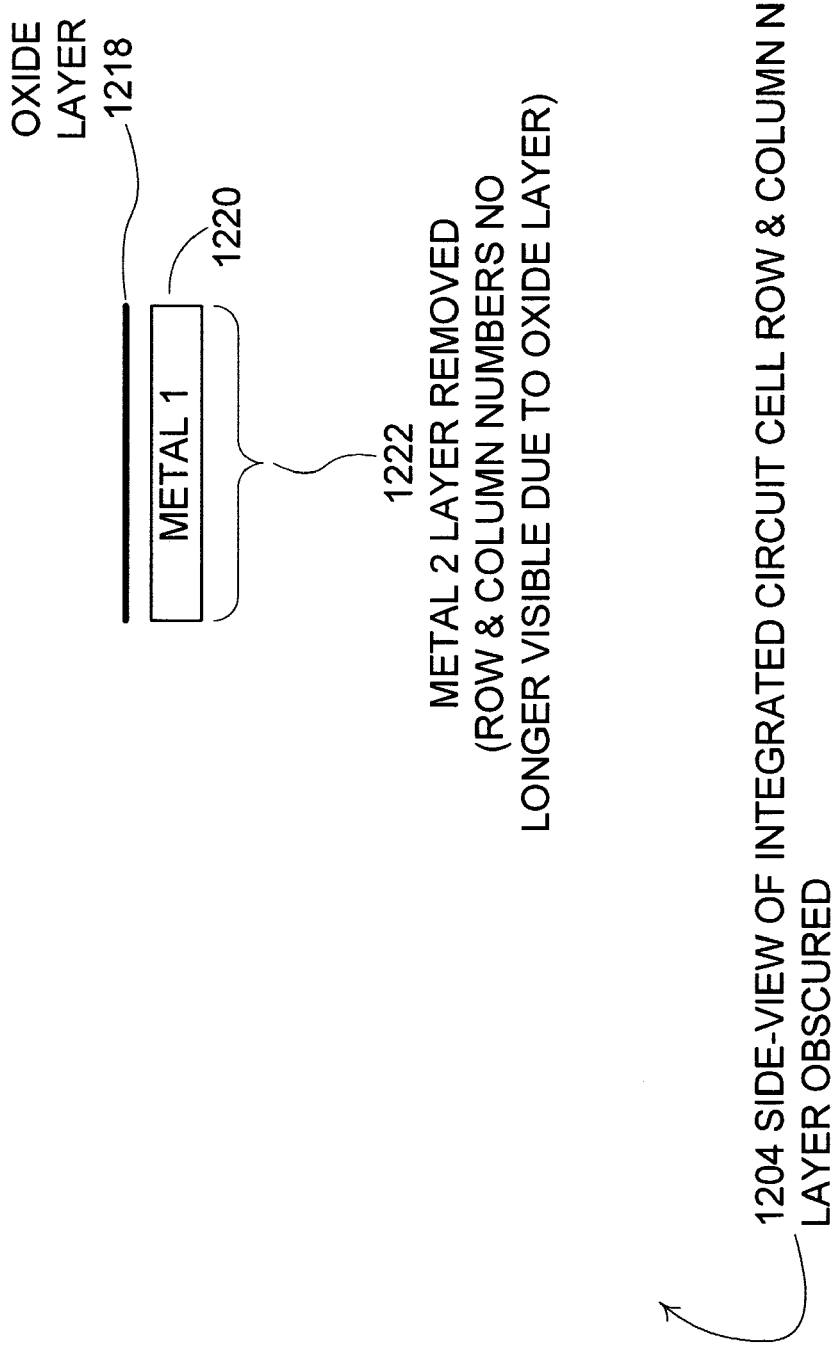

FIGS. 12A–D are illustrations of an embodiment of integrated circuit cell row and column numbers 1206 placed on all metal layers of the integrated circuit wafer to permit easy visual identification of an integrated circuit cell. FIG. 12A is an illustration 1201 of a top-view of the embodiment where the metal layer is present. FIG. 12B is an illustration 1202 of a top-view of the embodiment where the metal layer is obscured. FIG. 12C is an illustration 1203 of a side-view of the embodiment where the metal layer 1210 is present. FIG. 12D is an illustration 1204 of a side-view of the embodiment where the metal layer 1220 is obscured. A row and column number 1206 is placed on the metal layers 1210, 1214, 1220 to identify the row and column of the integrated circuit cell. The row and column number is best illustrated in the top-views 1201, 1202 of the embodiment. When the metal layer is removed, the row and column number is not visible 1208, 1222 until another metal layer is exposed. The layer removal process is a problem when a metal layer is removed and the oxide layer between metal layers is all that is visible. The side-views 1203, 1204 best illustrate how the oxide layer 1212, 1218 obscures the integrated circuit cell row and column numbers 1206.

Figure 13A:
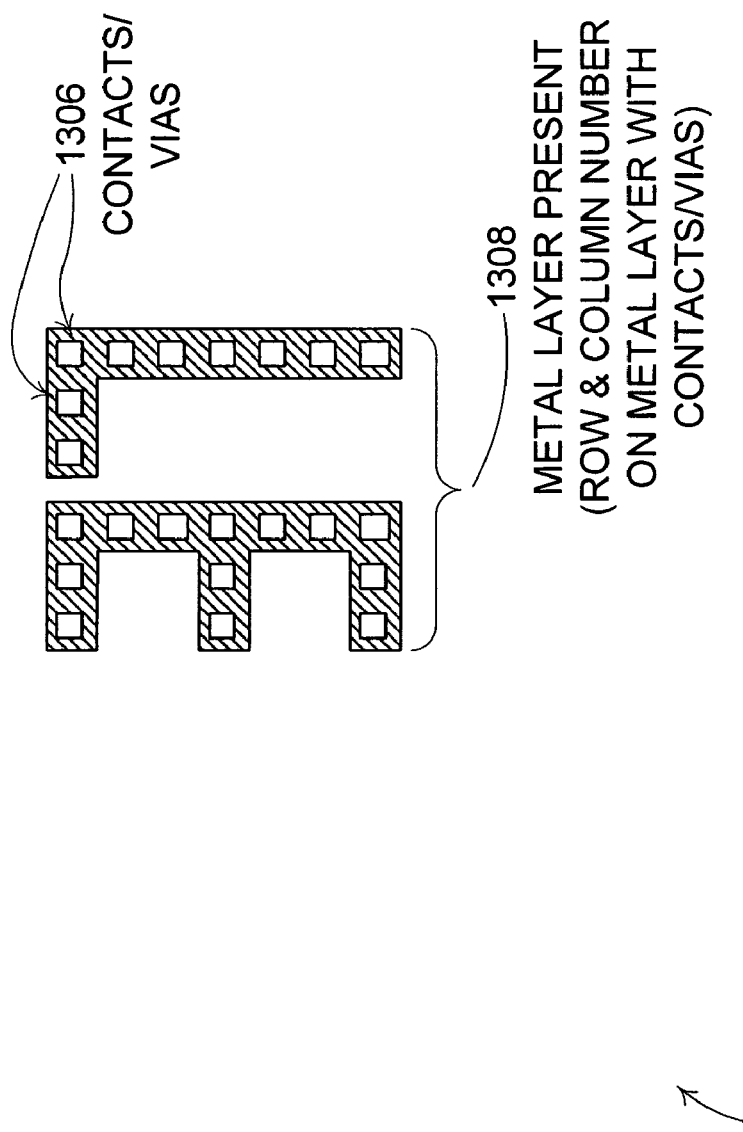
Figure 13C:
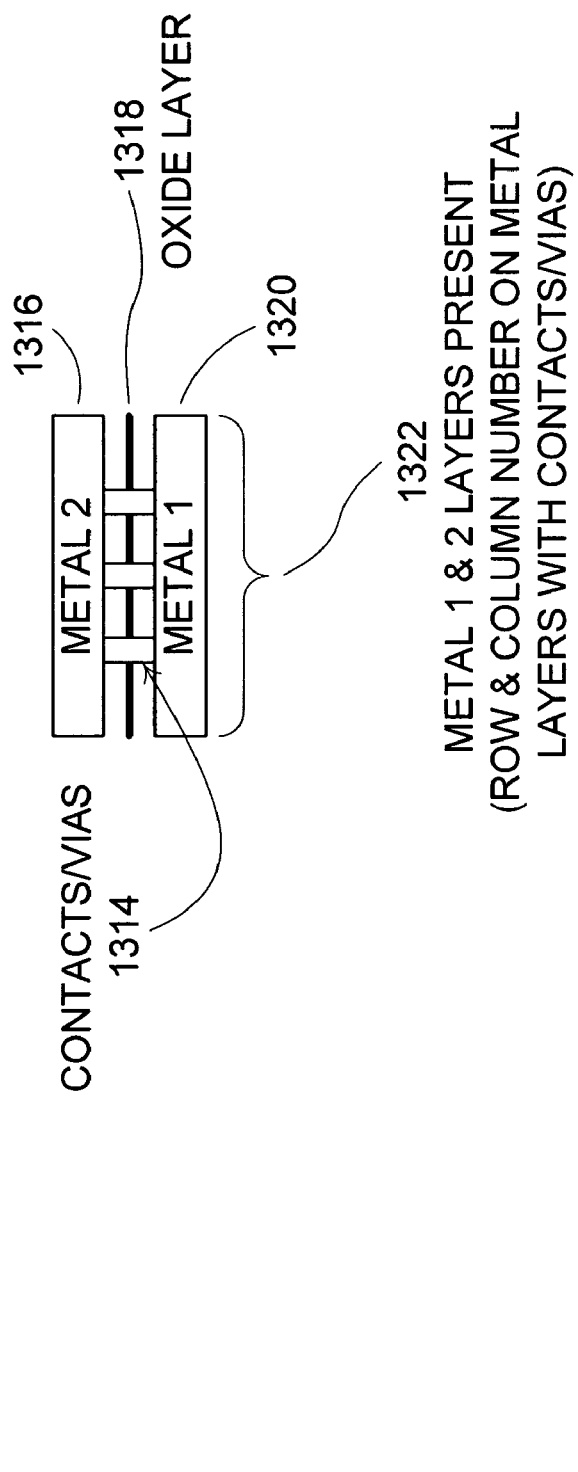
Figure 13D:
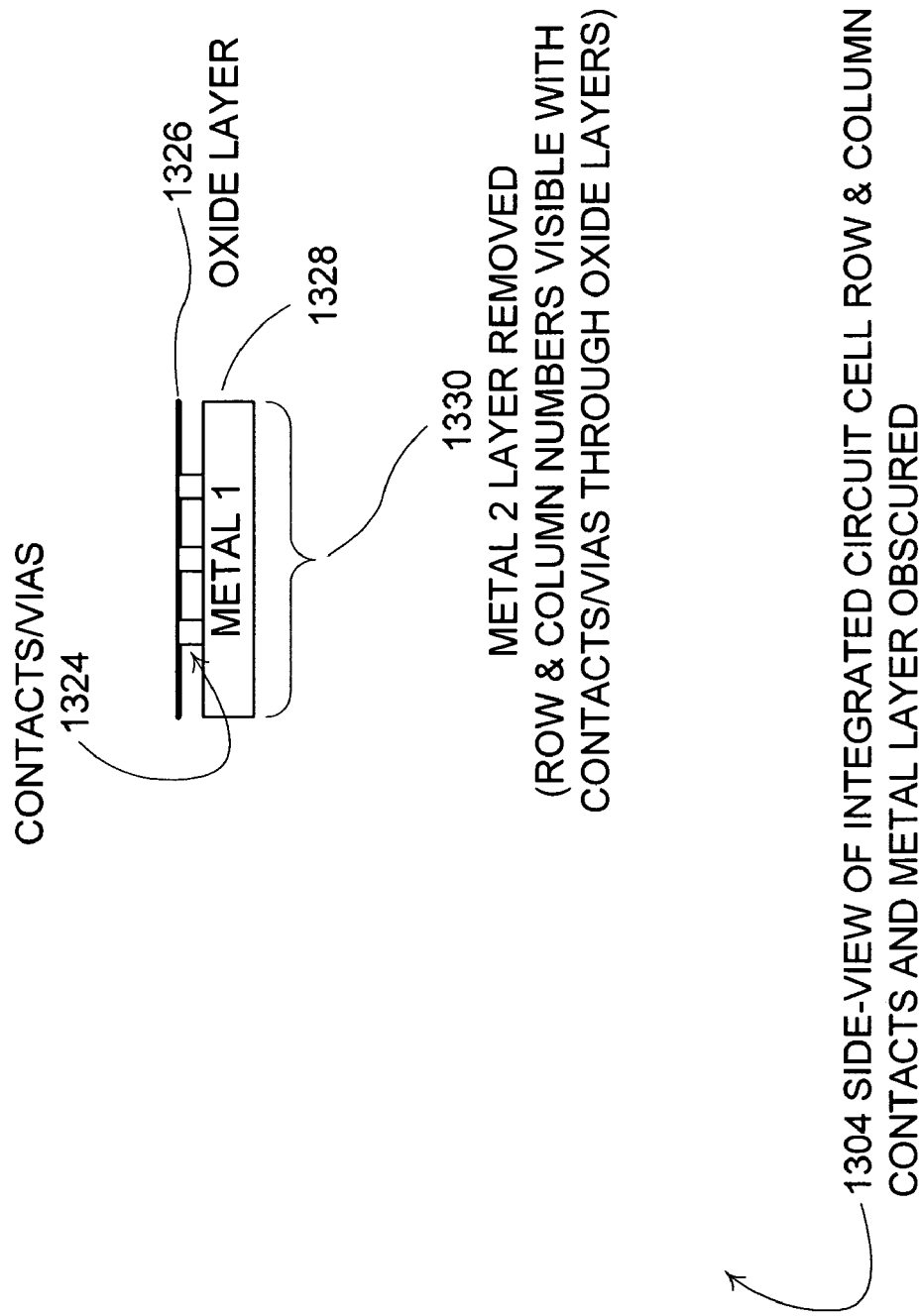

FIGS. 13A–D are illustrations of an embodiment 1300 of integrated circuit cell row and column numbers 1308, 1312 placed on all metal layers 1316, 1320, 1328 of an integrated circuit wafer with vias or contacts 1306, 1310, 1314, 1324 placed within the row and column numbers to permit easy identification of an integrated circuit cell, even when a metal layer 1316, 1320, 1328 is not exposed. FIG. 13A is an illustration 1301 of a top-view of the embodiment where the metal layer is present. FIG. 13B is an illustration 1302 of a top-view of the embodiment where the metal layer is obscured. FIG. 13C is an illustration 1303 of a side-view of the embodiment where the metal layer 1316 is present. FIG. 13D is an illustration 1304 of a side-view of the embodiment where the metal layer 1328 is obscured. Similar to the embodiment disclosed in the description of FIG. 12, a row and column number 1308 representing the integrated circuit cell is placed on all metal layers 1316, 1320, 1328 of the integrated circuit wafer. Vias and/or contacts 1306, 1310, 1314, 1324 are placed in such a way as to connect the integrated circuit row and column number 1308, 1312 and extending to other layers within the integrated circuit wafer. When on a metal layer 1316, 1320, 1328, the integrated circuit cell row and column number 1308, 1312, and the vias/contacts 1306, 1310, 1314, 1324 are visible 1312, 1330. The vias and/or contacts 1306, 1310, 1314, 1324 are contiguous through multiple layers, so when a metal layer 1316 is removed 1312, 1330, the vias/contacts 1310, 1324 are still visible. The top-views 1301, 1302 best illustrate how the integrated circuit row and column number 1308, 1312 appears when inspected, while the side-views 1303, 1304 best illustrate how the contacts/vias 1306, 1310, 1314, 1324 remain visible even when only the oxide layer 1318, 1326 is showing. The embodiment is valuable because performing inspections when the oxide layer 1318, 1326 is exposed may be necessary for proper failure analysis. The vias/contacts 1306, 1310, 1314, 1324 begin and end on whichever integrated circuit layers one skilled in the art deems appropriate for proper failure analysis purposes.

Figure 14A:
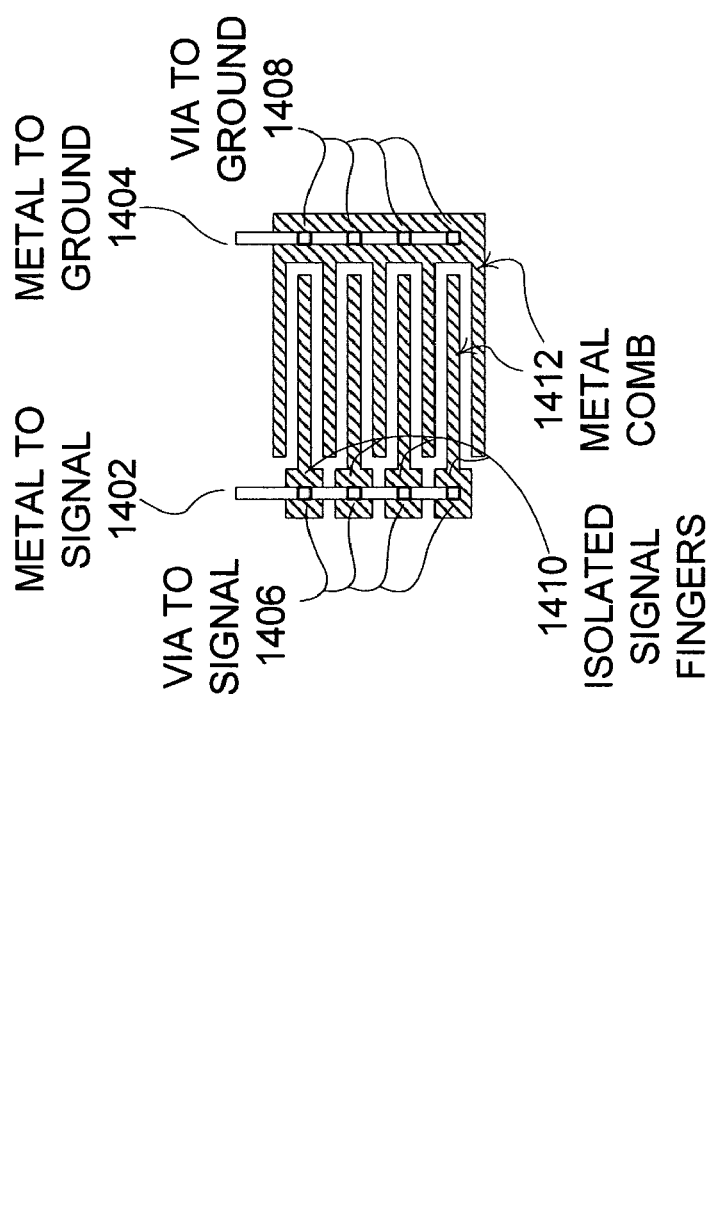
Figure 14B:
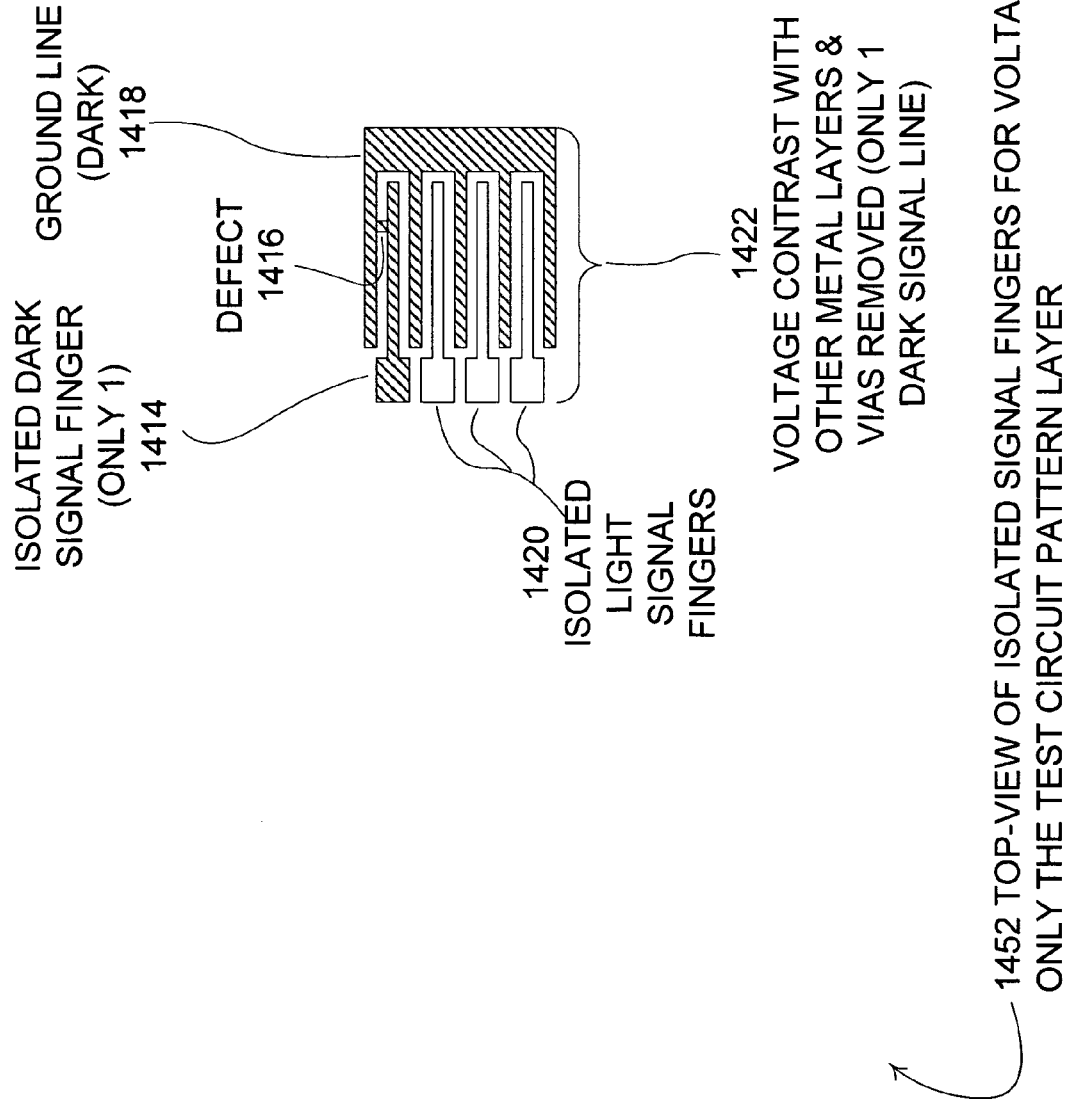

FIGS. 14A–C are top-views of an embodiment illustrating isolated signal fingers 1410, 1420 that permit voltage contrast and E-Beam inspection techniques to easily locate defects 1416 in the integrated circuit. FIG. 14A is an illustration 1451 of the embodiment showing all metal layers and vias. FIG. 14B is an illustration 1452 of the embodiment showing only the integrated circuit layer containing the test circuit pattern. FIG. 14C is an illustration 1453 of the embodiment showing only the vias. The embodiment uses a metal comb as the integrated circuit test circuit pattern to illustrate the benefits of isolating portions of a test integrated circuit pattern on one layer of an integrated circuit wafer. One half of the metal comb 1412 is attached to the signal trace metal layer 1402 using vias 1406. The other half of the metal comb 1412 is attached to the ground trace metal layer 1404 using vias 1408. If a defect 1416 occurs in the integrated circuit fabrication process, integrated circuit layers may be removed 1422 to show the metal layer of the test circuit for inspection purposes. Since a metal comb circuit may consist of many thousands of comb fingers, locating a single defect can be very tedious using typical inspection techniques. Isolating portions of the test integrated circuit pattern on a single layer allows a defective integrated circuit to remove the electrically connecting metal layer, exposing the isolated test circuit pattern to assist in defect location. Each individual comb finger 1410, 1414, 1420 of the signal half of the metal comb circuit is electrically isolated on the test circuit pattern metal layer. The signal fingers of the metal comb 1410 are electrically connected to the signal trace metal layer 1402 using vias 1406. The via connection between metal layers provides the electrical continuity for sending an electric signal through the metal comb 1412. When a defect 1416 is detected, integrated circuit layers may be removed to expose the test circuit pattern metal layer 1422, and the isolated signal fingers 1414, 1420 on the test circuit pattern metal layer 1422. With the isolated signal fingers 1414, 1420, only the ground line of the metal comb 1418 and the individual signal finger 1414 containing the defect appear grounded (i.e., dark) when using voltage contrast and E-Beam failure analysis techniques. Signal finger isolation allows quick and easy location of a defect 1416 within the metal comb test circuit pattern 1442. When integrated circuit layers are removed, but the oxide layer obscures the metal comb layer 1430, the vias may be inspected using voltage contrast and E-Beam failure analysis techniques to determine which signal finger 1426 is grounded (i.e., is dark). The grounded vias 1428 also appear dark, matching the grounded signal finger 1426. The ungrounded signal fingers 1424 appear light when using voltage contrast and E-Beam failure analysis techniques. With the vias 1424, 1426, 1428 showing through the oxide layer, signal finger isolation allows failure analysis personnel to quickly and easily locate a defect 1416 even when the metal comb layer is not directly exposed 1430.

Figure 15:
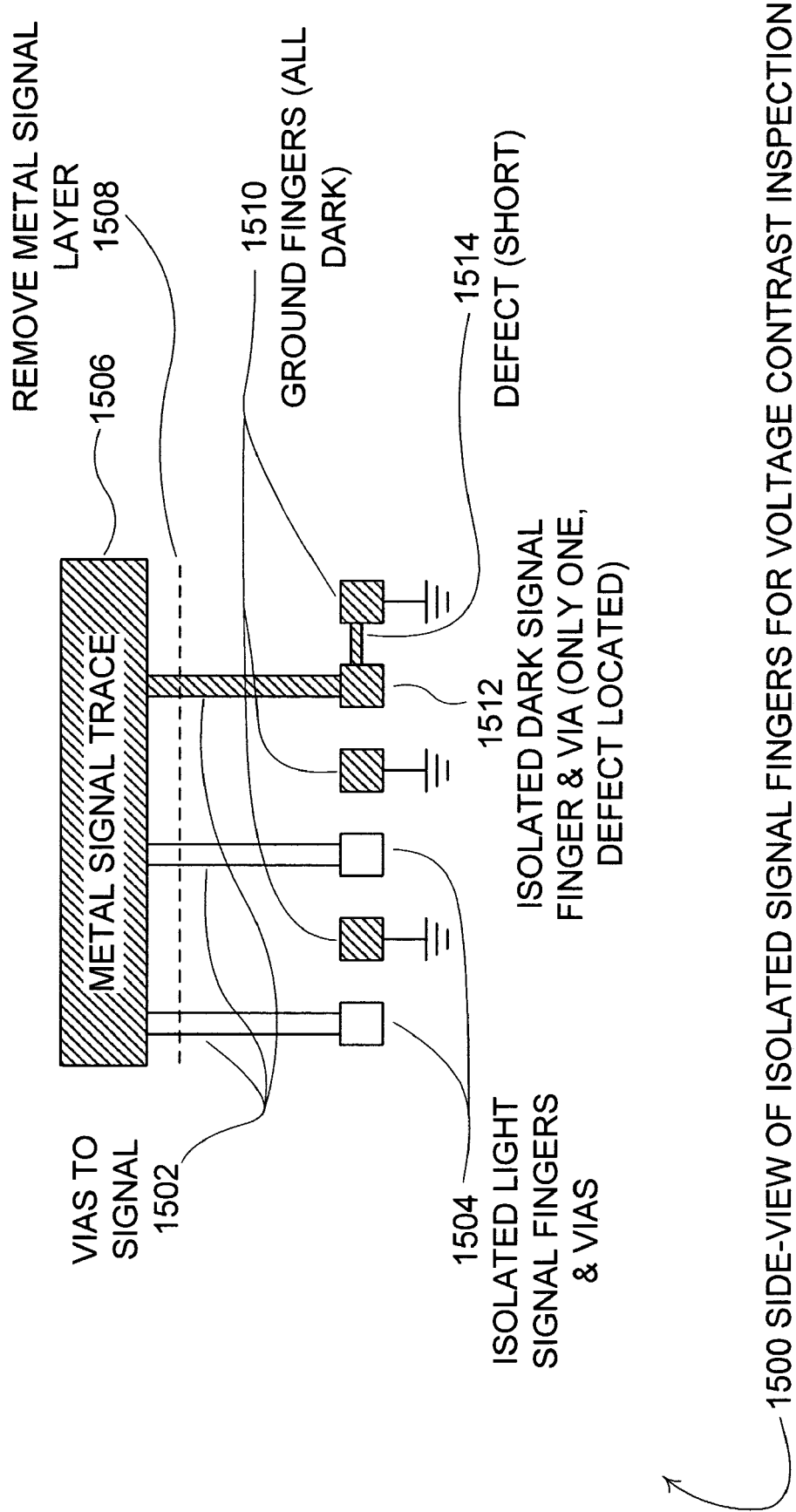
FIG. 15 is a side-view of the embodiment illustrated in FIGS. 14A–C of isolated signal fingers that permit voltage contrast and E-Beam inspection techniques to easily locate defects in the integrated circuit.

FIG. 15 is a side-view of the embodiment 1500 illustrated in FIGS. 14A–C of isolated signal fingers 1504, 1512 that permit voltage contrast and E-Beam inspection techniques to easily locate defects 1514 in the integrated circuit. The side-view illustration of the embodiment 1500 shows a metal comb test integrated circuit pattern on a metal layer, electrically connected to a signal trace metal layer 1506 using vias 1502. The ground trace metal layer and the metal comb ground line are not shown since the ground trace metal layer and the metal comb ground line are not necessary to understand the side-view illustration of the embodiment 1500. The signal fingers 1504, 1512 of the metal comb are shown as projections coming out of the page, and the ground fingers 1510 of the metal comb are shown as projections going into the page. The signal trace metal layer 1506 is shown to illustrate the eventual electrical connection for the signal fingers 1504, 1512 of the metal comb. The signal fingers 1504, 1512 are electrically isolated on the metal comb layer. Vias 1502 connect the metal comb isolated signal fingers 1504, 1512 to the signal trace metal layer 1506. Each signal finger 1504, 1512 of the metal comb integrated circuit is isolated by providing an expanded pad for the vias 1502 to attach to the isolated signal fingers 1504, 1512 on the metal comb layer. A line 1508 is provided to illustrate where the signal trace metal 1506 may be removed to allow inspection of the vias 1502. The electrical connection for the metal comb signal fingers is established with the signal trace metal layer 1506, which is connected to each signal finger 1504, 1512 on the metal comb layer using vias 1502. If there is a defect 1514 on a single signal finger 1512 of the metal comb circuit, and the signal trace metal layer 1506 is in place, then the entire signal metal comb structure appears grounded (i.e., dark) when using voltage contrast techniques. Once the signal trace metal layer 1506 is removed 1508, the vias 1502 tied to each signal finger 1504, 1512 allow passive voltage contrast or E-Beam failure analysis techniques to show that only the via for the signal finger 1512 affected by the defect 1514 is grounded (i.e., dark). All other isolated signal fingers and attached vias 1504 appear normally (i.e., light), thus allowing quick identification of a defect 1514 in a large interconnect module test circuit. Isolating portions of an interconnect module circuit pattern is not limited to metal comb structures. Serpentines and other test patterns may also be isolated into smaller sections with the electrical connection for the signal being accomplished on another, removable, layer using vias between layers. Isolating other patterns will have the same improved defect location effect as seen for the metal comb test circuit pattern.

The various embodiments are useful for the development and verification of integrated circuit manufacturing processes. In a typical use, one of the embodiments would be designed using target design parameters for a new manufacturing process. Such design parameters may include the minimum trace width and the maximum number of stacked vias. An embodiment may be manufactured into an integrated circuit using the new manufacturing process. Any problems with the integrated circuit would be quickly isolated to the exact via or trace where the problem exists. The problems would then be traced back to the specific process, reticule, or other manufacturing issue as necessary. When the process is able to produce one or more of the embodiments of the present invention without creating any faults, the process may be certified and mass production may begin.

The embodiments may be further useful for verifying existing manufacturing processes. For an established manufacturing process, it may be desirable to periodically produce one of the various embodiments to evaluate any problems with the manufacturing process and to verify proper operation.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of testing a manufacturing process of an integrated circuit test vehicle comprising the steps of:
    designing said integrated circuit test vehicle, said integrated circuit test vehicle comprising:
        a plurality of unit delay cells wherein each said unit delay cell comprises a unit cell input, a unit cell output, a library driving cell, and an interconnect module wherein said unit cell input is connected to said library driving cell, said library driving cell is further connected to said interconnect module, said interconnect module is further connected to said unit cell output, said plurality of unit delay cells are connected in series to each other from said unit delay cell output to said unit delay cell input creating a chain of said unit delay cells;
        an input signal trace that is connected to the lead unit delay cell unit cell input of said chain of said unit delay cells; and
        an output signal trace that is connected to the last unit delay cell unit cell output of said chain of said unit delay cells;
    manufacturing said integrated circuit test vehicle using said manufacturing process;
    applying a test signal to said input signal trace of said integrated circuit test vehicle;
    reading a result signal from said output signal trace of said integrated circuit test vehicle;
    comparing said result signal to a predetermined reference signal; and
    concluding that said manufacturing process is defective if said result signal does not match said predetermined reference signal.

2. The method of claim 1 wherein said integrated circuit test vehicle further comprises:
    said library driving cells being comprised of at least one of the group comprising: a NAND gate, a NOR gate, a buffer, and an inverter.

3. The method of claim 1 wherein said integrated circuit test vehicle further comprises:
    said interconnect modules being comprised of at least one of the group comprising: a capacitor, a metal comb, a serpentine, a contact chain, and a via chain.

4. The method of claim 1 wherein said integrated circuit test vehicle further comprises:
    said input signal trace being connected to an external clock signal and said output signal trace being a clock output signal logically correlating to said external clock.

5. The method of claim 4 wherein said integrated circuit test vehicle further comprises:
    an inverting select cell wherein said inverting select cell has a ring oscillator enable input, two select cell data inputs, and a select cell data output;
    said select cell data output being connected to said input signal trace;
    one of said two select cell data inputs being connected to said external clock signal;
    the other of said two select cell data inputs being connected to said unit delay cell chain output signal trace;
    the state of said ring oscillator enable input determining which of said two select cell data inputs is inverted and sent to said select cell data output; and
    said output signal trace of said chain of said unit delay cells being delivered externally as said clock output signal.

6. The method of claim 5 wherein said integrated circuit test vehicle further comprises:
    said clock output signal being further connected to one of said two select cell inputs as said external clock signal.

7. A method of testing a manufacturing process of an integrated circuit test vehicle comprising the steps of:
    designing said integrated circuit test vehicle, said integrated circuit test vehicle comprising:
    a plurality of unit delay cells wherein each unit delay cell comprises a plurality of unit delay cell inputs, a plurality of unit delay cell outputs, a plurality of library driving cells arranged side-by-side, and a plurality of interconnect modules arranged on overlapping layers, wherein a single unit delay cell input of said plurality of unit delay cell inputs is connected to a single library driving cell of said plurality of library driving cells, said single library driving cell being connected to a single interconnect module of said plurality of interconnect modules, said single interconnect module being connected to a single unit delay cell output of said plurality of unit delay cell outputs;

said plurality of unit delay cells being connected in series to each other from said plurality of unit delay cell outputs to said plurality of unit delay cell inputs creating a chain of said unit delay cells;

a plurality of input signal traces that are connected to the lead unit delay cell plurality of unit cell inputs of said chain of said unit delay cells; and a plurality of output signal traces that are connected to the last unit delay cell plurality of unit cell outputs of said chain of said unit delay cells;

manufacturing said integrated circuit test vehicle using said manufacturing process;

applying a plurality of test signals to said plurality of input signal traces of said integrated circuit test vehicle;

reading a plurality of result signals from said plurality of output signal traces of said integrated circuit test vehicle;

comparing said plurality of result signals to a plurality of predetermined reference signals; and concluding that said manufacturing process is defective if said plurality of result signals do not match said plurality of predetermined reference signals.

8. The method of claim 7 wherein said integrated circuit test vehicle further comprises:

said library driving cells being comprised of at least one of the group comprising: a NAND gate, a NOR gate; a buffer, and an inverter.

9. The method of claim 7 wherein said integrated circuit test vehicle further comprises:

said interconnect modules being comprised of at least one of the group comprising: a capacitor, a metal comb, a serpentine, a contact chain, and a via chain.

* * * * *